United States Patent
Mizukami

(10) Patent No.: US 10,103,315 B2
(45) Date of Patent: Oct. 16, 2018

(54) ELECTRO-MECHANICAL TRANSDUCTION ELEMENT, MANUFACTURING METHOD OF MANUFACTURING ELECTRO-MECHANICAL TRANSDUCTION ELEMENT, DROPLET DISCHARGE HEAD, AND DROPLET DISCHARGE DEVICE

(71) Applicant: Satoshi Mizukami, Kanagawa (JP)

(72) Inventor: Satoshi Mizukami, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 403 days.

(21) Appl. No.: 14/715,670

(22) Filed: May 19, 2015

(65) Prior Publication Data

US 2015/0349240 A1 Dec. 3, 2015

(30) Foreign Application Priority Data

May 28, 2014 (JP) .................................. 2014-110179

(51) Int. Cl.
*H01L 41/187* (2006.01)
*H01L 41/047* (2006.01)
(Continued)

(52) U.S. Cl.
CPC .......... *H01L 41/1876* (2013.01); *B41J 2/161* (2013.01); *B41J 2/1628* (2013.01); *B41J 2/1629* (2013.01); *B41J 2/1631* (2013.01); *B41J 2/1642* (2013.01); *B41J 2/1645* (2013.01); *B41J 2/1646* (2013.01); *H01L 41/047* (2013.01); *H01L 41/0477* (2013.01); *H01L 41/257* (2013.01)

(58) Field of Classification Search
CPC H01L 41/1876; H01L 41/0477; H01L 41/257

USPC .......................................................... 310/358
See application file for complete search history.

(56) References Cited

U.S. PATENT DOCUMENTS

| | | | |
|---|---|---|---|
| 7,562,968 B2 | 7/2009 | Sumi et al. | |
| 7,884,531 B2 * | 2/2011 | Shibata | ............... H01L 41/1873 |
| | | | 252/62.9 PZ |

(Continued)

FOREIGN PATENT DOCUMENTS

| | | |
|---|---|---|
| JP | 2011-181776 | 9/2011 |
| JP | 4984018 | 7/2012 |

(Continued)

OTHER PUBLICATIONS

Office Action dated Feb. 27, 2018 issued with respect to the basic Japanese Patent Application No. 2014-110179.

*Primary Examiner* — Bryan Gordon
(74) *Attorney, Agent, or Firm* — IPUSA, PLLC

(57) ABSTRACT

An electro-mechanical transduction element includes a lower electrode formed above a substrate; an electro-mechanical transduction film which is formed on the lower electrode and includes a perovskite-type crystal containing lead zirconate titanate (PZT); and an upper electrode formed on the electro-mechanical transduction film, wherein, in a state where the electro-mechanical transduction film is not bound by the substrate, a peak position of X-ray diffraction caused by a plane (200) of the electro-mechanical transduction film is $2\theta=44.45°$ or greater and 44.75° or smaller, and a peak of diffraction caused by the plane (200) or a plane (400) of the electro-mechanical transduction film has an asymmetry property.

12 Claims, 12 Drawing Sheets

(51) Int. Cl.
  *H01L 41/257* (2013.01)
  *B41J 2/16* (2006.01)

(56) References Cited

U.S. PATENT DOCUMENTS

| | | | |
|---|---|---|---|
| 7,918,542 B2 | 4/2011 | Sakashita et al. | |
| 2008/0074471 A1* | 3/2008 | Sakashita | C04B 35/2683 347/68 |
| 2008/0265718 A1* | 10/2008 | Sakashita | B41J 2/14233 310/358 |
| 2009/0121374 A1* | 5/2009 | Shibata | C04B 35/495 264/40.1 |
| 2012/0305665 A1* | 12/2012 | Ohashi | B41J 2/055 239/102.2 |
| 2012/0319533 A1 | 12/2012 | Kubota et al. | |

FOREIGN PATENT DOCUMENTS

| | | |
|---|---|---|
| JP | 2012-253161 | 12/2012 |
| JP | 2013-102024 | 5/2013 |
| JP | 5267082 | 8/2013 |
| JP | 2014-60291 | 4/2014 |
| JP | 2008-94707 | 4/2018 |

\* cited by examiner

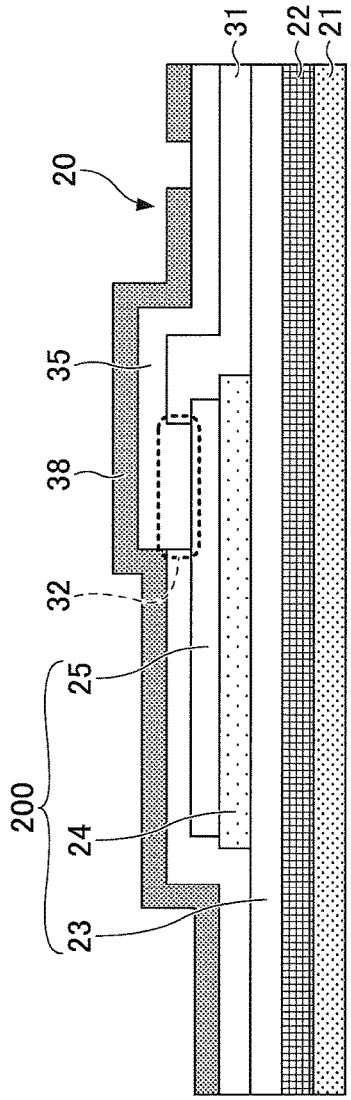
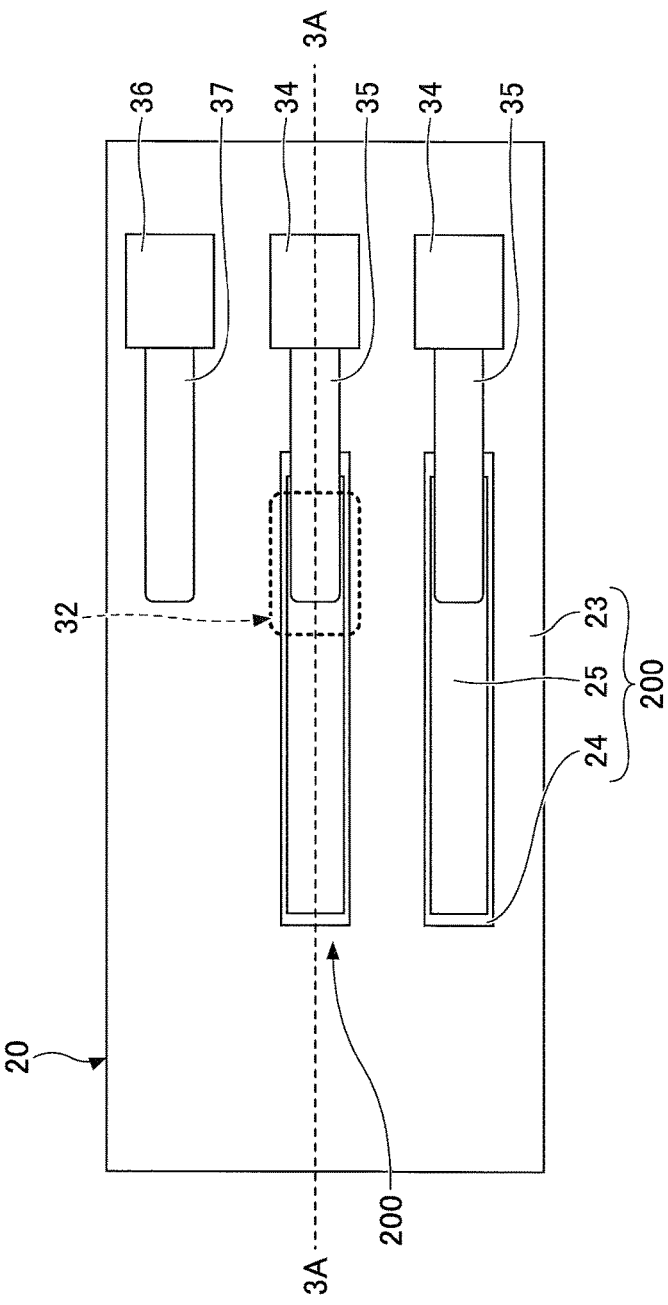
FIG.3A
FIG.3B

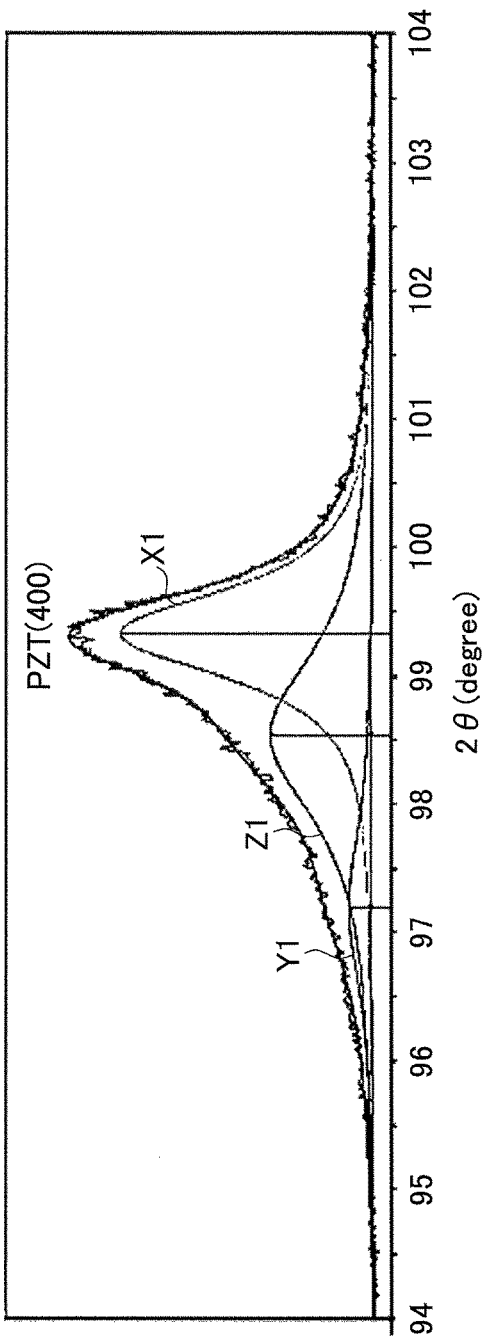
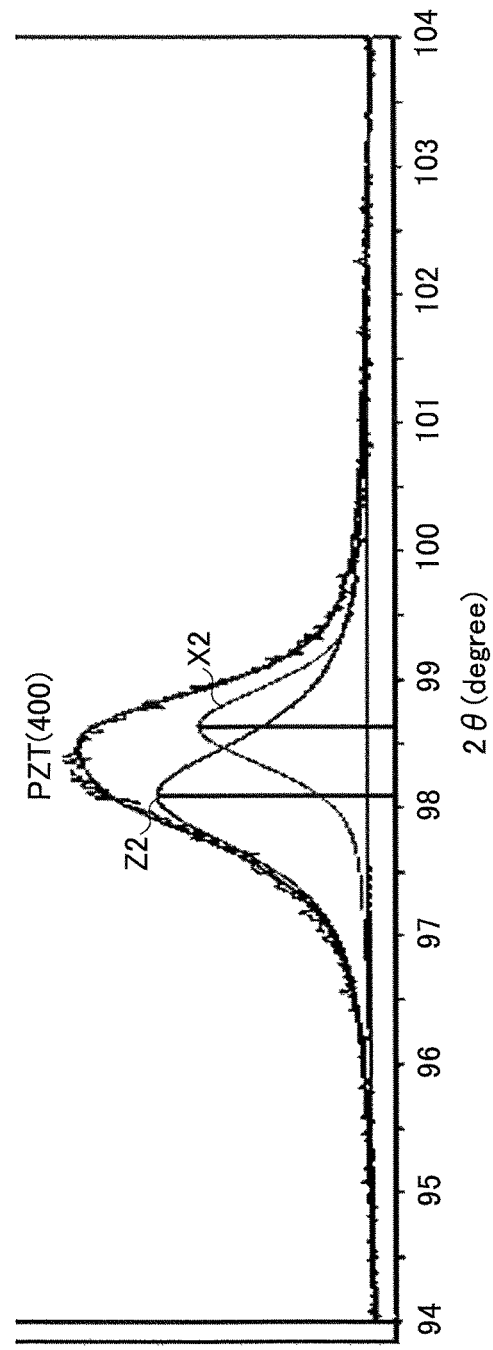
FIG.8A
FIG.8B

FIG.15

| | ORIENTATION RATE OF PZT(100) | PEAK POSITION OF PZT (200) | ASYMMETRY PROPERTY (PZT(200)) | NUMBER OF BELONGING CRYSTAL STRUCTURE | d31 | |
|---|---|---|---|---|---|---|
| | | | | | INITIAL STAGE | AFTER 10^10 TIMES |
| EXAMPLE 1 | 95% | 44.65° | 0.25 | 3 | -142 | -140 |
| EXAMPLE 2 | 98% | 44.71° | 0.37 | 3 | -144 | -139 |
| EXAMPLE 3 | 98% | 44.76° | 0.45 | 3 | -142 | -135 |
| EXAMPLE 4 | 96% | 44.52° | 0.15 | 3 | -132 | -131 |
| EXAMPLE 5 | 93% | 44.46° | 0.04 | 3 | -125 | -122 |
| EXAMPLE 6 | 82% | 44.65° | 0.27 | 3 | -134 | -132 |
| EXAMPLE 7 | 76% | 44.64° | 0.23 | 3 | -125 | -123 |
| COMPARATIVE EXAMPLE 1 | 85% | 44.32° | 0.01 | 1 | -96 | -92 |
| COMPARATIVE EXAMPLE 2 | 96% | 44.93° | 0.89 | 2 | -101 | -81 |

ELECTRO-MECHANICAL TRANSDUCTION ELEMENT, MANUFACTURING METHOD OF MANUFACTURING ELECTRO-MECHANICAL TRANSDUCTION ELEMENT, DROPLET DISCHARGE HEAD, AND DROPLET DISCHARGE DEVICE

BACKGROUND OF THE INVENTION

1. Field of the Invention

The present invention generally relates to an electro-mechanical transduction element, a manufacturing method of manufacturing the electro-mechanical transduction element, a droplet discharge head, and a droplet discharge device.

2. Description of the Related Art

An electro-mechanical transduction element (hereinafter, referred to as a piezoelectric element) has a property wherein the shape of the electro-mechanical transduction element changes depending on a voltage applied to the electro-mechanical transduction element. Using this property, the electro-mechanical transduction element is used for a droplet discharge head of an image forming apparatus and various uses. Two types of an inkjet record head are put into practical use. One type uses a piezoelectrc actuator of a longitudinal vibration mode where the piezoelectric element extends or contracts in the axis direction of the piezoelectric element, and the other type uses a piezoelectrc actuator of a deflection vibration mode. These piezoelectrc actuators require a piezoelectric element which can provide a stable and good ink discharge property by ensuring an amount of the displacement of the ink.

Therefore, the piezoelectric element includes a piezoelectric body film made of a perovskite-type crystal including, for example, at least Pb, Ti, and Zr and an electrode which is provided in the piezoelectric body film and has a peak position of X-ray diffraction caused by a (100) plane of the piezoelectric body film of 1.97°. In addition, there is a piezoelectric element having a full-width at half maximum ($2\theta$) of a plane (200) of 0.30 or greater and 0.50 or smaller (for example, Patent Document 1).

Further, a peak position of X-ray diffraction caused by a plane (100) of a piezoelectric body film made of lead zirconate titanate (PZT) and is perovskite-type crystal having a preferred orientation on the plane (100) is within a range of $2\theta=21.79°$ to 21.88°. Further, there is a piezoelectric element having a distance between the planes (100) at the peak positions of X-ray diffraction of 4.05±0.03 and the stress inside a film of 100 MPa to 200 MPa (for example, Patent Document 2).

Patent Document 1: Japanese Laid-Open Patent Publication No. 2012-253161

Patent Document 2: Japanese Patent No. 4984018

SUMMARY OF THE INVENTION

It is a general object of at least one embodiment of the present invention to provide an electro-mechanical transduction element, a manufacturing method of manufacturing the electro-mechanical transduction element, a droplet discharge head, and a droplet discharge device that substantially obviate one or more problems caused by the limitations and disadvantages of the related art.

One aspect of the embodiments of the present invention may be to provide an electro-mechanical transduction element including a lower electrode formed above a substrate; an electro-mechanical transduction film which is formed on the lower electrode and includes a perovskite-type crystal containing lead zirconate titanate (PZT); and an upper electrode formed on the electro-mechanical transduction film, wherein, in a state where the electro-mechanical transduction film is not bound by the substrate, a peak position of X-ray diffraction caused by a plane (200) of the electro-mechanical transduction film is $2\theta=44.45°$ or greater and 44.75° or smaller, and a peak of diffraction caused by the plane (200) or a plane (400) of the electro-mechanical transduction film has an asymmetry property.

Additional objects and advantages of the embodiments will be set forth in part in the description which follows, and in part will be clear from the description, or may be learned by practice of the invention. Objects and advantages of the invention will be realized and attained by means of the elements and combinations particularly pointed out in the appended claims.

BRIEF DESCRIPTION OF THE DRAWINGS

FIG. 3A illustrates a structure of the electro-mechanical transduction element of the first embodiment.

FIG. 3B illustrates the structure of the electro-mechanical transduction element of the first embodiment.

FIG. 8A is a graph illustrating an asymmetry property on a plane (400) of a PZT film.

FIG. 8B is a graph illustrating the asymmetry property on the plane (400) of a PZT film.

FIG. 15 is a table illustrating durability test results of examples 1 to 7 and comparative examples 1 and 2.

DETAILED DESCRIPTION OF THE PREFERRED EMBODIMENTS

Figure 1:
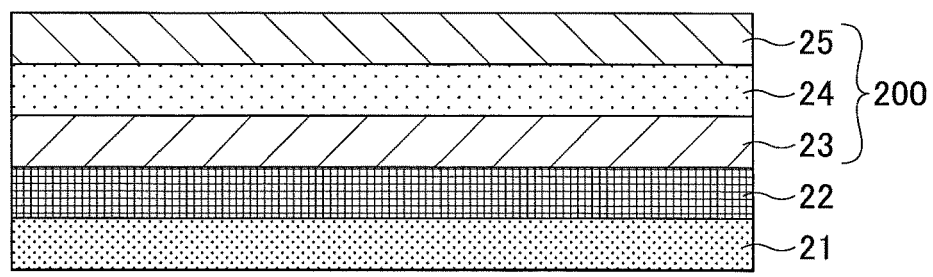
FIG. 1 is a cross-sectional view schematically illustrating an electro-mechanical transduction element of a first embodiment.

Patent Documents 1 and 2 disclose a structure formed based on a peak position of X-ray diffraction caused by a low angle side of the plane (100) of the piezoelectric body film. It is preferable to have an asymmetry property to sufficiently obtain the amount of the displacement to optimally maintain an ink discharge property or the like. However, at the peak position caused by the low angle side of the plane (100), it is difficult to determine the asymmetry property, and it is difficult to determine whether asymmetry exists from information of a full-width at half maximum (2θ) of the plane (200). As to the peak position of the diffraction, a crystal lattice strain changes and a lattice constant and the peak position of the diffraction change whether the substrate is bound. However, the Patent Documents 1 and 2 do not describe a state where the substrate is bound or is not bound (a stress free state). Said differently, the bind of the substrate is not considered in the structures of the Patent Documents 1 and 2. Therefore, the electro-mechanical transduction element formed based on the peak position caused by the plane (100) on the low angle side of the Patent Documents 1 and 2 may not obtain the amount of the displacement sufficient to preferably perform the ink discharge property or the like.

A description is given below, with reference to the FIG. 1 through FIG. 15 of embodiments of the present invention. Where the same reference symbols are attached to the same parts, repeated description of the parts is omitted.

Reference symbols typically designate as follows:
20: electro-mechanical transduction element;
21: substrate;
22: vibration plate;
23: lower electrode;
24: electro-mechanical transduction film (PZT film);
25: upper electrode;
31: first insulative protection film;
32: contact hole;
34: individual electrode pad;
36: common electrode pad;
38: second insulative protection film;
80: pressurizing room; and
81: nozzle.

[First Embodiment]

Within a first embodiment, a structural example of the electro-mechanical transduction element of the present invention is described. The electro-mechanical transduction element of the first embodiment includes a lower electrode formed above the substrate, an electro-mechanical transduction film containing lead zirconate titanate (PZT) formed on the lower electrode, and an upper electrode formed on the electro-mechanical transduction film.

Further, the electro-mechanical transduction film has a peak position of X-ray diffraction caused by a plane (200) of 2θ=44.45° or greater and 44.75° or smaller and a peak of diffraction caused by the plane (200) or a plane (400) has an asymmetry property, in a state where the electro-mechanical transduction film is not bound by the substrate.

Further, the electro-mechanical transduction film has a peak position of X-ray diffraction caused by a plane (200) of 2θ=44.50° or greater and 44.80° or smaller and the peak of the diffraction caused by the plane (200) or the plane (400) has the asymmetry property, in a state where the electro-mechanical transduction film is bound by the substrate.

<Structure>

Figure 2:
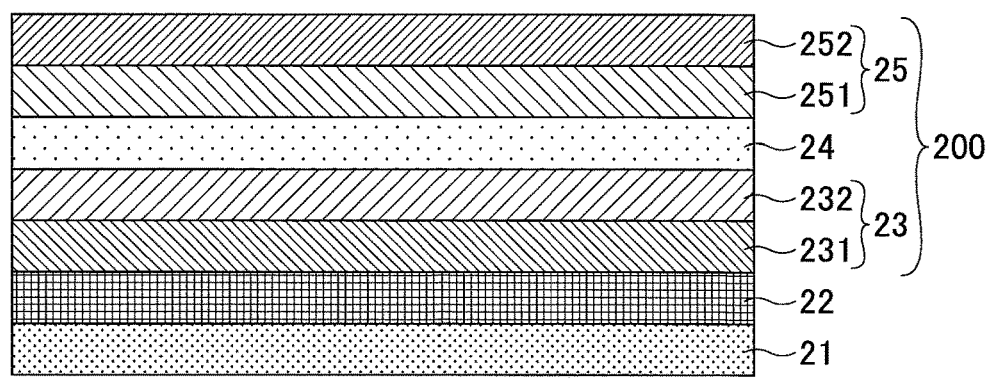
FIG. 2 is a detailed cross-sectional view of the electro-mechanical transduction element of the first embodiment.

Next, a specific structure of the electro-mechanical transduction element of the first embodiment is described using FIGS. 1 and 2. FIG. 1 is a cross-sectional view schematically illustrating the electro-mechanical transduction element of the first embodiment. FIG. 2 is a detailed cross-sectional view of the electro-mechanical transduction element of the first embodiment.

The electro-mechanical transduction element 20 of the first embodiment includes a substrate 21, a vibration plate 22, a lower electrode 23, an electro-mechanical transduction film 24, and an upper electrode 25. The lower electrode 23, the electro-mechanical transduction film 24, and the upper electrode 25 are especially provided for electro-mechanical transduction and may be generally referred to as an electro-mechanical transduction part 200.

The lower electrode 23 and the upper electrode 25 preferably includes a metallic layer providing a sufficient electrical resistance. Specifically, as illustrated in FIG. 2, the metallic layer is a first electrode 231 in the lower electrode 23 and a fourth electrode 252 in the upper electrode 25.

Further, when the electro-mechanical transduction film 24 is functioned as an actuator, in order to restrict a drop of displacement or the like when the electro-mechanical transduction film 24 is continuously functioned, it is preferable to include an oxide electrode layer having conductivity in an interface between the electro-mechanical transduction film 24 and the lower and upper electrodes 23 and 25. Specifically, referring to FIG. 2, a second electrode 232 in the lower electrode 23 and a third electrode 251 in the upper electrode 25 correspond to the oxide electrode layer.

FIG. 3 specifically illustrates a structure of the electro-mechanical transduction element 20 of the first embodiment used for, for example, the droplet discharge head or the like. FIG. 3A is a cross-sectional view of the electro-mechanical transduction element of the first embodiment. FIG. 3B is a plan view of the electro-mechanical transduction element of the first embodiment. Referring to FIG. 3B, the first and second insulative protection films 31 and 38 (interlayer insulating films) are omitted to facilitate understanding of the structure. FIG. 3A is a cross-sectional view taken along a line 3A-3A of FIG. 3B.

Referring to FIG. 3A, the electro-mechanical transduction element 20 of the first embodiment includes the electro-mechanical transduction part 200 including the lower electrode 23, the electro-mechanical transduction film 24, and the upper electrode 25. This electro-mechanical transduction part 200 is arranged above the substrate 21. A vibration plate 22 is provided on the substrate 21.

One common electrode of any one electrode of the lower electrode 23 and the upper electrode 25 can be formed as a common electrode common to multiple electro-mechanical transduction parts 200. In this case, the other electrode of the lower electrode 23 and the upper electrode 25 is formed as an individual electrode corresponding to each of the multiple electro-mechanical transduction parts 200. Referring to FIG. 3, the lower electrode 23 is provided as the single electrode common to the multiple electro-mechanical transduction parts 200 and the upper electrode 25 is provided as the individual electrode independent from each of the multiple electro-mechanical transduction parts 200. However, the present invention is not limited to the above mode illustrated in FIG. 3.

Further, the first insulative protection film 31 is provided above the upper electrode 25 (the third electrode 251 and the fourth electrode 252) and the lower electrode 23 (the first electrode 231 and the second electrode 232). It is preferable that the first insulative protection film 31 is made of an inorganic compound as described below. It is preferable that a contact hole 32 is provided in the first insulative protection film 31 to enable an electrical connection of the upper electrode 25 and the lower electrode 23 with another electrode.

Each individual electrode, which is, for example, the upper electrode 25 illustrated in FIG. 3, may be connected with a corresponding individual electrode pad 34. A connection member 35 for connecting the individual electrode and the individual electrode pad may electrically connect the individual electrode and the individual electrode pad 35.

The common electrode, which is, for example, the lower electrode 23 illustrated in FIG. 3, may be connected with the common electrode pad 36. A connection member 37 for connecting the individual electrode and the individual electrode pad may electrically connect the common electrode and the common electrode pad.

Further, it is possible to provide a second insulative protection film 38 above the common electrode pad 36 and the individual electrode pad 34. It is preferable that the second insulative protection film 38 is made of an inorganic compound as described below. Further, the second insulative protection film 38 preferably has an opening portion, through which the common electrode pad and the individual electrode pad are exposed.

Described is a method of applying a polarization treatment to the electro-mechanical transduction element having the above structure. The polarization treatment can be performed by a polarization treatment apparatus 40 illustrated in, for example, FIG. 4. The polarization apparatus 40 includes a corona electrode 41 and a grid electrode 42. The corona electrode 41 and the grid electrode 42 are connected to a power source 411 for the corona electrode and a power source 421 for the grid electrode, respectively. It is preferable that a mesh is processed in the grid electrode 42 so that ions, electric charges, and so on generated by corona discharge are efficiently spread over a sample stage when a high voltage is applied to the corona electrode 41. Further, it is preferable that an earth cable 44 is connected with a stage 43, on which a sample is mounted, so that the electric charges easily flows through the sample. Further, the stage 43 may be provided with a temperature adjusting function so that the electro-mechanical transduction element can be heated, for example. Although a heating temperature at this time is not specifically limited, it is preferable that the temperature adjusting function can heat up to a maximum temperature of 350° C.

The voltages applied to the corona electrode and the grid electrode and the distances between the sample and these electrodes are not specifically limited and can be adjusted so as to be able to sufficiently provide a sufficient polarization treatment depending on the sample. Thus, the corona discharge can be made strong or weak.

Figure 5:
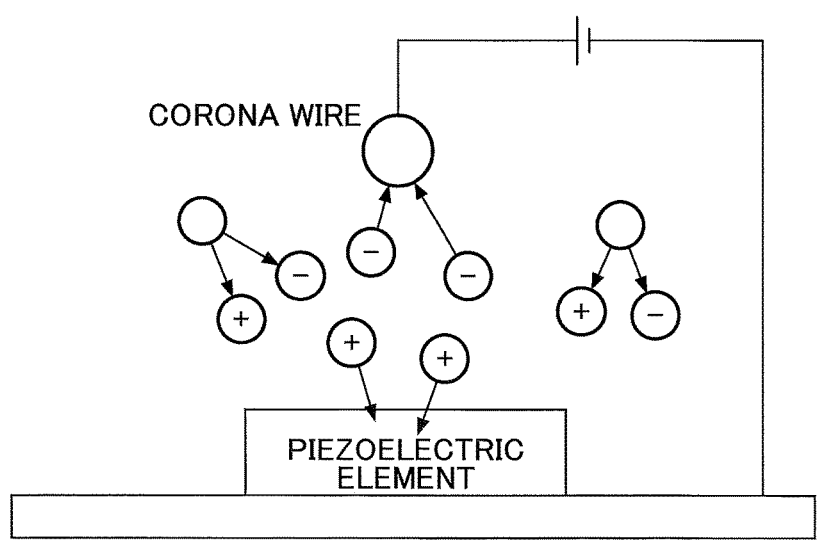
FIG. 5 explains the polarization treatment.

In a case where the corona discharge is performed using the corona electrode 41 (a corona wire) as described above, the polarization treatment functions to generate positive ions by causing molecules in the atmospheric air to be ionized as illustrated in FIG. 5. The generated positive ions flow into the electro-mechanical transduction element 20 through, for example, the common electrode pad or the individual electrode pad of the electro-mechanical transduction element. Thus, electric charges are accumulated in the piezoelectric element. A difference of electric charges in the upper electrode and the lower electrode is supposed to cause an internal potential difference to be generated so as to perform the polarization treatment.

At this time, the charge amount Q necessary for the polarization treatment is not specifically limited. However, it is preferable the electro-mechanical transduction element accumulates a charge amount of $1.0 \times 10^{-8}$ C or greater, more preferably, $4.0 \times 10^{-8}$ C. By accumulating this charge amount in the electro-mechanical transduction element, it is possible to perform a polarization treatment so as to more securely obtain a polarizability as described later.

The state of the polarization treatment can be determined from a P-E hysteresis loop of the electro-mechanical transduction element. Referring to FIG. 6, a method of determining the polarization treatment is described.

Figure 6A:
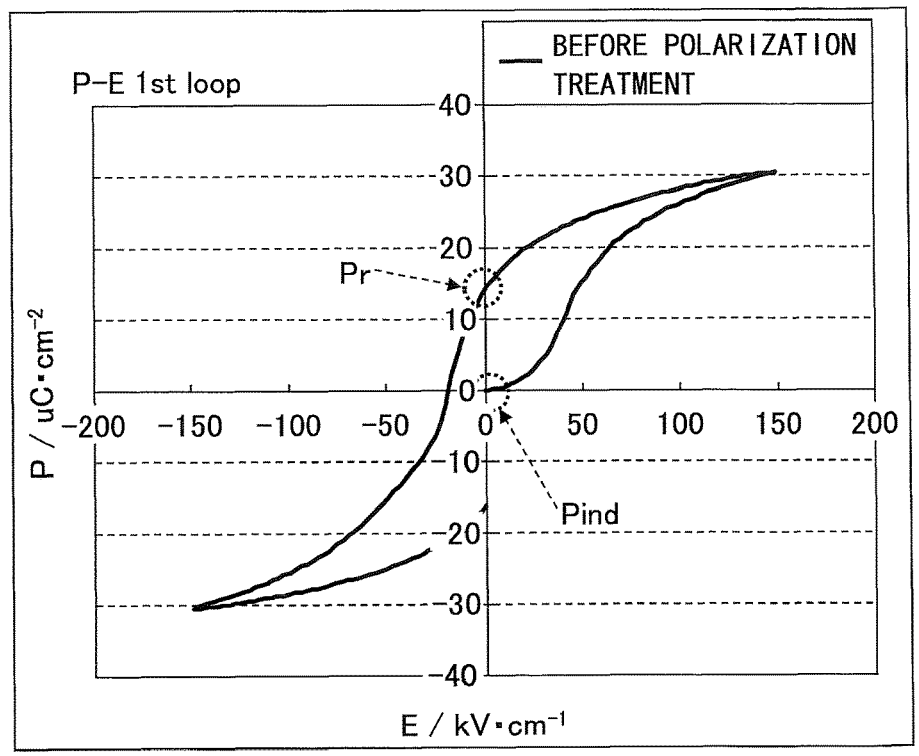
FIG. 6A explains Pr and Pind.
Figure 6B:
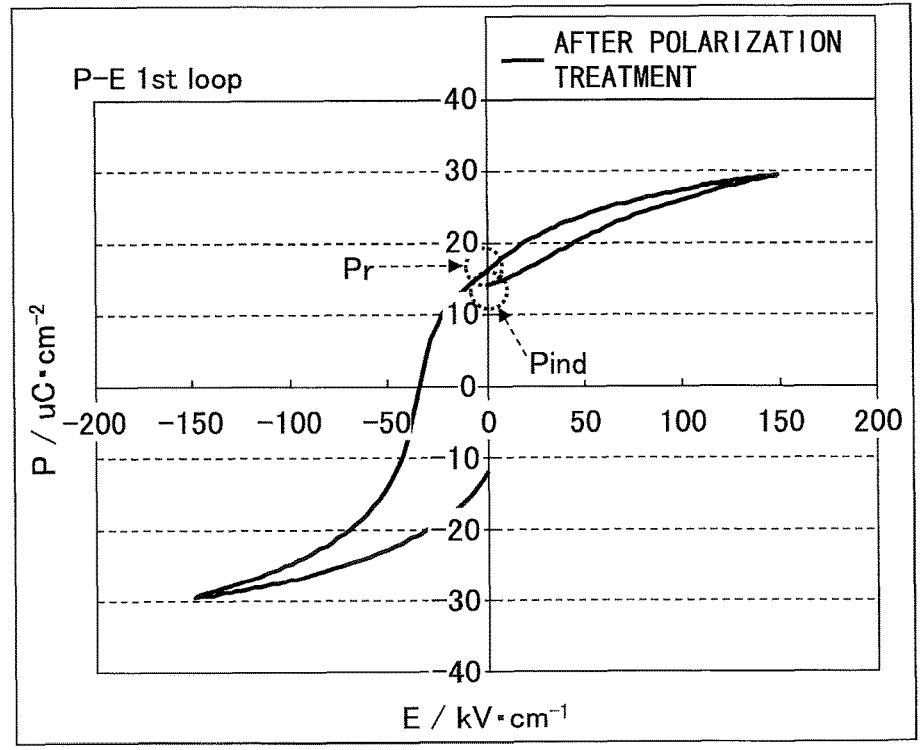
FIG. 6B explains Pr and Pind.
Figure 7:
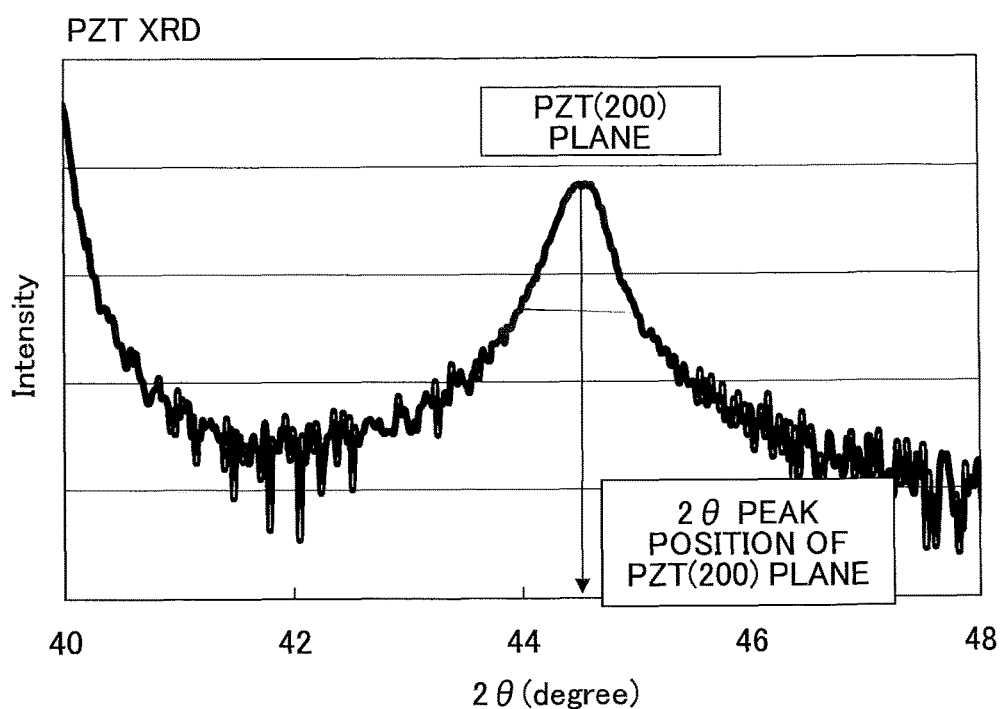
FIG. 7 is a graph illustrating a relationship between a peak position of diffraction and an asymmetry property on a plane (200) of a PZT film.

An example of the P-E hysteresis loop is illustrated in FIGS. 6A and 6B. FIG. 6A illustrates the P-E hysteresis loop of the sample before performing the polarization treatment. FIG. 6B illustrates the P-E hysteresis loop of the sample after performing the polarization treatment.

Referring to FIGS. 6A and 6B, in a case where a hysteresis loop is measured by applying an electric field intensity of ±150 kV/cm to the electro-mechanical transduction film, a polarization at a time of 0 kV/cm before applying a voltage is designated by Pind and a polarization at a time of returning to 0 kV/cm after applying a voltage of +150 kV/cm is designated by Pr.

At this time, a value of Pr-Pind is defined as a polarizability and it is possible to determine whether a state of the polarization is appropriate by the polarizability. Specifically, it is preferable that a value of the polarizability Pr-Pind for the sample provided with the polarization treatment is a predetermined value or smaller as illustrated in FIG. 6B. For example, the value of the polarizability Pr-Pind is preferably 10 µC/cm$^2$ or smaller, more preferably, 5 µC/cm$^2$ or smaller. In a case where the value of Pr-Pind is not sufficiently small, the polarization is not sufficiently performed. Therefore, the electro-mechanical transduction element 20 is in a state where the amount of the displacement relative to a predetermined drive voltage is not stabilized.

<Member>

Within a first embodiment, various members of the electro-mechanical transduction element of the first embodiment is described. As described above, the electro-mechanical transduction element 20 of the first embodiment may be formed on the vibration plate 22.

The material of the substrate 21 is not specifically limited. However, in consideration of easiness in a processing work and a ready availability, it is preferable to use a silicon single crystal substrate.

The silicon single crystal substrate includes three plane direction types (100), (110), and (111). However, the plane direction is not specifically limited, and an appropriate substrate can be selected depending on the content of the processing work.

For example, in a case where an etching process of the substrate is required, it is possible to select the substrate having a predetermined plane direction in conformity with the content of the etching process. In a case where a droplet discharge head described below is exemplified, a pressurizing room is ordinarily formed in the substrate by etching. An etching method at this time is ordinarily an anisotropic etching. Here, the anisotropic etching utilizes a property such that an etching rate changes depending on a plane direction of a crystal structure. For example, in the anisotropic etching performed by dipping into an alkaline solution such as KOH, the etching rate of a plane (111) is about ¹⁄₄₀₀ of the etching rate of a plane (100). Therefore, a structure having an inclination of about 54° can be formed for the plane direction (100), and a deep trench can be formed for the plane direction (110). Thus, it is known that the alignment density can be increased while maintaining a better rigidity. Therefore, it is preferable to use the silicon single crystal substrate having the plane direction (100) for the substrate forming the droplet discharge head.

The thickness of the substrate 21 can be selected depending on a use or the like. Although it is not specifically limited, the thickness of the substrate 21 is preferably 100 µm to 600 µm.

As to the droplet discharge head described below, the vibration plate receives a force generated by the electro-mechanical transduction film 24 so that a foundation (the vibration plate) deforms and displaces to cause an ink droplet in a pressure chamber to be discharged. Therefore, the foundation preferably has a predetermined strength. The material is Si, $SiO_2$, or $Si_3N_4$ made by a CVD method. Further, it is preferable to select a material having a linear expansion coefficient approximate to linear expansion coefficients of the lower electrode 23 and the electro-mechanical transduction film 24. Specifically, because the material of the electro-mechanical transduction film 24 is ordinarily PZT, the linear expansion coefficient of the electro-mechanical transduction film 24 is made of a material preferably having a linear expansion coefficient of $5 \times 10^{-6}$ to $10 \times 10^{-6}$ (1/K), more preferably having a linear expansion coefficient of $7 \times 10^{-6}$ to $9 \times 10^{-6}$ (1/K), approximate to $8 \times 10^{-6}$ (1/K) of the linear expansion coefficient of PZT. The material is specifically aluminum oxide, zirconium oxide, iridium oxide, ruthenium oxide, tantalum oxide, hafnium oxide, osmium oxide, rhenium oxide, rhodium oxide, or palladium oxide, or a compound of at least one of these oxides. It is preferable to make these by a spin coater using a sputtering method or a sol-gel method. The film thickness is preferably 0.1 to 10 μm, more preferably 0.5 to 3 μm. If the film thickness is thinner than this range, it becomes difficult to process the above pressure chamber. If the film thickness is thicker than this range, the foundation hardly deforms and displaces so as to make a discharge of an ink droplet unstable.

The lower electrode 23 and the upper electrode 25 are not specifically limited and can be arbitrarily selected. For example, the lower electrode 23 and the upper electrode 25 may be made of a metallic electrode film or an oxide electrode film, preferably a laminated body of laminating the metallic electrode film and the oxide electrode film.

The lower electrode 23 and the upper electrode 25 preferably includes a metallic layer providing a sufficient electrical resistance. Specifically, as illustrated in FIG. 2, the metallic layer is a first electrode 231 in the lower electrode 23 and a fourth electrode 252 in the upper electrode 25.

The metallic material of the first electrode 231 and the fourth electrode 252 may be platinum having a high heat resistance and a low reactivity. However, there may be a case where a barrier property against lead is insufficient. Therefore, it is preferable to use a platinum group element such as iridium and platinum-rhodium or an alloy film of these. Because a contact between platinum and the foundation (especially, $SiO_2$) is bad in a case where platinum is used, it is preferable to first laminate Ti, $TiO_2$, Ta, $Ta_2O_5$, and $Ta_3N_5$. A method of making this is preferably a vacuum film formation such as a sputtering method or a vapor deposition. The film thickness is preferably 0.05 to 1 μm, more preferably 1 to 0.5 μm.

Further, referring to FIG. 2, the lower electrode 23 and the upper electrode 25 may preferably have an oxide electrode layer having conductivity through the interface between the lower and upper electrode 23 and 25 and the electro-mechanical transduction film 24. Specifically, it is preferable to provide an oxide electrode layer in the interface. Here, the oxide electrode layer is the second electrode 232 in the lower electrode 23 and the third electrode 251 in the upper electrode 25.

The second electrode 232 and the third electrode 251 are made of, preferably, $SrRuO_3$ or $LaNiO_3$. Because the second electrode 232 effects an orientation control of the electro-mechanical transduction film 24 (the PZT film) formed on the second electrode 232, a material to be selected changes depending on a preferred orientation of the electro-mechanical transduction film 24 (the PZT film). In this structure, the preferred orientation is the PZT (100). Therefore, the second electrode 232 is made by forming a seed of $LaNiO_3$ or $TiO_2$ or a seed layer of $PbTiO_3$ on the first electrode 231, and thereafter the PZT film is formed. The third electrode 251 forming the upper electrode 25 is SRO. The film thickness of the third electrode is preferably 20 nm to 80 nm, more preferably 30 nm to 50 nm. If the film thickness of the third electrode is thinner than the film thickness range, an initial displacement and a displacement degradation property are not optimum. If the film thickness of the third electrode is thicker than the film thickness range, a dielectric strength voltage of the PZT to be formed is bad so as to be apt to leak. A film formation method of forming an oxide electrode film is not specifically limited. For example, a sputtering method can be used for film formation.

Next, described is the electro-mechanical transduction film 24. The electro-mechanical transduction film 24 (a piezoelectric body film) is preferably made of an oxide containing Pb. Specifically, it is preferable to use PZT in this embodiment. Hereinafter, electro-mechanical transduction film 24 may be described as a PZT film 24. The PZT is a solid solution of lead zirconate ($PbZrO_3$) and lead titanate ($PbTiO_3$) and the property of the PZT changes depending on a ratio between lead zirconate ($PbZrO_3$) and lead titanate ($PbTiO_3$). A composition having the ratio between lead zirconate ($PbZrO_3$) and lead titanate ($PbTiO_3$) of 53:47 ordinarily shows an excellent piezoelectric property. The chemical formula of the composition is $Pb(Zr0.53,Ti0.47)O_3$, which is generally called PZT (53/47).

In a case where the PZT is used as the electro-mechanical transduction film 24 and the preferred orientation is the plane (100) of PZT, the composition ratio of Zr/Ti represented by Ti/(Zr+Ti) is preferably 0.45 (45%) or greater and 0.55 (55%) or smaller, more preferably 0.48 (48%) or greater and 0.52 (52%).

As described, it is known that the 2θ peak position (the peak position of diffraction) of the plane (200) of PZT and an asymmetry property of the peaks change by adjusting the composition ratio as described above. Therefore, by controlling the 2θ peak position of the plane (200) of PZT and the asymmetry property of the peaks so as to be good, the amount of the displacement enabling to maintain a good ink discharge property can be ensured. Hereinafter, the detail is explained.

Figure 10:
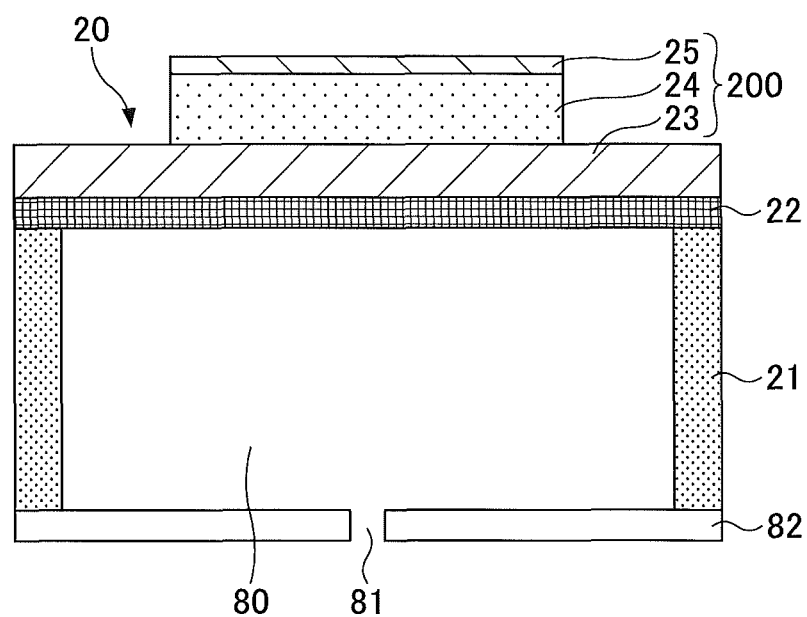
FIG. 10 illustrates a structure of a droplet discharge head of a second embodiment of the present invention.

The peak position of diffraction of the plane (200) of PZT is specifically determined in a state where the PZT film is not bound by a foundation substrate after processing a liquid chamber when a droplet discharge head is formed as illustrated in FIG. 10. In this case, because the crystal lattice extends in the vertical direction of the substrate, the peak position of diffraction (2θ) becomes small. Specifically, in the state where there is no bind of the foundation substrate, it is preferable that 2θ=44.45° or greater and 44.75° or smaller, more preferably 2θ=44.55° or greater and 44.70° or smaller.

Further, in a case where a cantilever (described below) is formed, the PZT film 24 is bound by the foundation substrate. The peak position of the plane (200) of PZT is 2θ=44.50° or greater and 44.80° or smaller, more preferably 2θ=44.65° or greater and 44.75° or smaller.

If the portion of Ti is smaller than the above described range in the composition ratio of Zr/Ti or the 2θ position (the peak position of diffraction) is smaller than the above described range, the amount of the displacement accompanied by a rotational strain is reduced and the amount of the displacement cannot be sufficiently ensured. On the contrary, if the portion of Ti is greater than the above described range in the composition ratio of Zr/Ti or the 2θ position (the peak position of diffraction) is greater than the above described range, the amount of the displacement caused by a piezoelectric strain is reduced and the amount of the displacement cannot be sufficiently ensured. In controlling the peak position of diffraction of the plane (100) of PZT on the low angle side, it is difficult to determine whether the asymmetry property for ensuring the amount of the displacement exists. However, within the embodiment, because the control is performed based on the peak position of the diffraction of the plane (200) of PZT on the high angle side, the asymmetry property is securely obtainable. The control may be performed for the plane (400) of PZT instead of the plane (200) of PZT.

Next, the PZT film having the above composition ratio of Zr/Ti and controlled to have the 2θ position (the peak position of diffraction) of the above range is provided with a peak separation from an XRD diffraction strength so as to identify the belonging crystal structure. FIGS. 8A and 8B illustrates a result of the peak separation by focusing on the plane (400). FIG. 8A illustrates a case where the asymmetry property of the diffraction peak on the plane (400) is great, and FIG. 8B illustrates a case where the asymmetry property of the diffraction peak on the plane (400) is small.

In the case where the asymmetry property of the diffraction peak on the plane (400) is great as illustrated in FIG. 8A, the crystal structure belongs to any one of three crystal structures. Specifically, these three crystal structures are an a domain structure X1 of a tetragonal crystal, a c domain structure Y1 of the tetragonal crystal, or a mixed structure Z1 of at least one of a rhombohedral crystal, an orthorhombic crystal, and a pseudo-cubic crystal.

In the case where the asymmetry property of the diffraction peak on the plane (400) is small as illustrated in FIG. 8B, the crystal structure belongs to any one of two crystal structures. Specifically, these two crystal structures are an a domain structure X2 of the tetragonal crystal or a mixed structure Z2 of at least one of the rhombohedral crystal, the orthorhombic crystal, and the pseudo-cubic crystal.

In the case where the crystal structure belongs to any one of the three crystal structures as illustrated in FIG. 8A, the amount of the displacement becomes very great in comparison with the case where the crystal structure belongs to any one of the two crystal structures as illustrated in FIG. 8B. This is because a strain accompanied by the rotational strain becomes great. In FIGS. 8A and 8B, the plane (400) was analyzed. Results similar to those in FIGS. 8A and 8B were obtained for the plane (200). In order to sufficiently ensure the amount of the displacement, it is important that the asymmetry property of the diffraction peak on the high angle side is conspicuous and the crystal structure belongs to the above three crystal structures.

Figure 9:
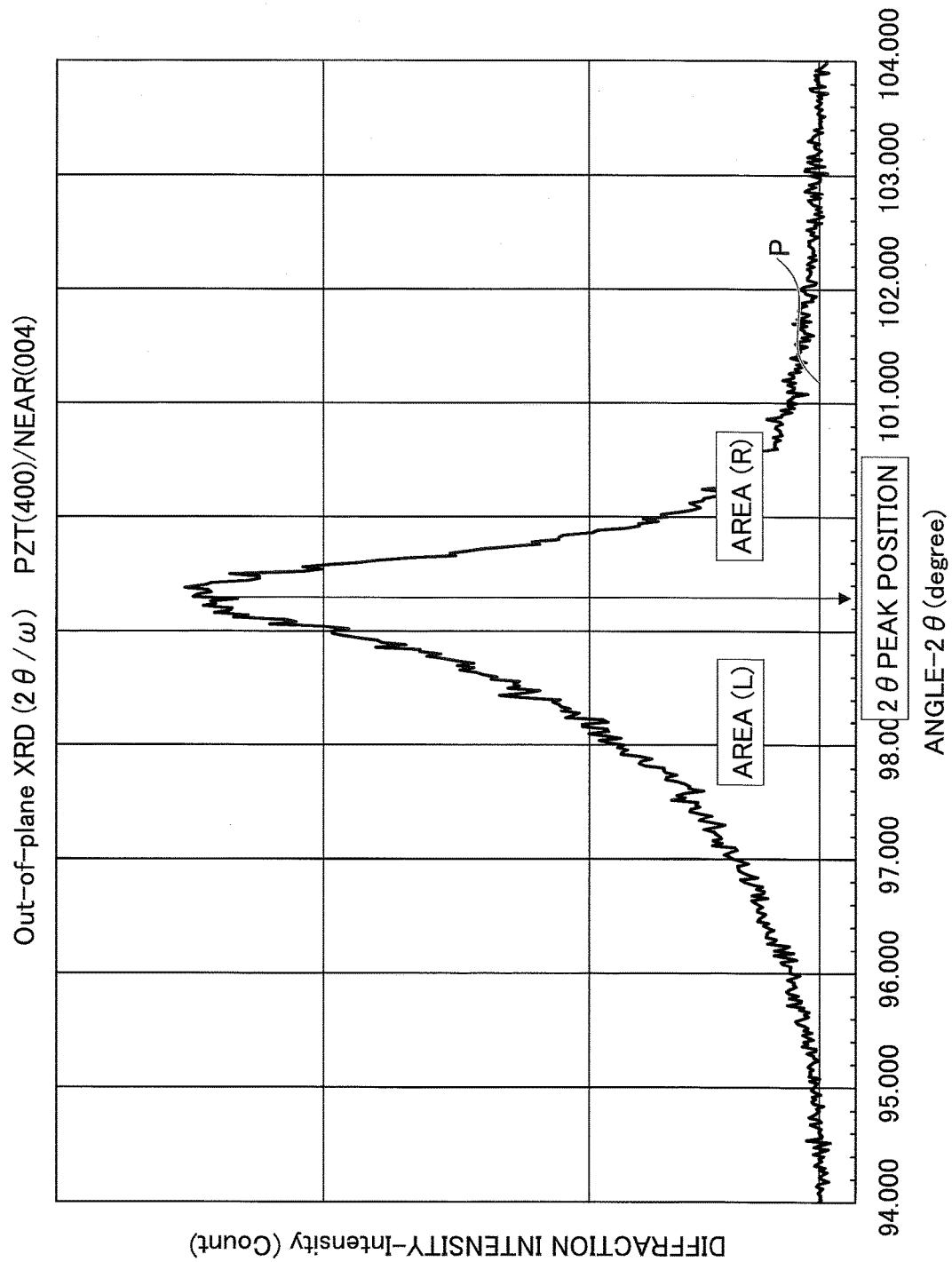
FIG. 9 explains a definition of the asymmetry property.

The asymmetry property to sufficiently ensure the amount of the displacement is defined and set as follows based on FIG. 9. The asymmetry property is calculated by the following formula. [Formula 1] asymmetry property (Asym)= (area(L)−area(R))/(area(L)+area(R)), where the area(L) designates a peak area on the left side from the center of the peak position of the plane (200) and above a reference line P, and the area(R) designates a peak area on the right side from the center of the peak position of the plane (200) and above the reference line P.

The asymmetry property (Asym) obtained by Formula 1 is preferably 0.03 or greater and 0.45 or smaller, more preferably 0.15 or greater and 0.35 or smaller.

If the asymmetry property (Asym) is smaller than the above range, the amount of the displacement accompanied by the rotational strain is lessened and the amount of the displacement cannot be sufficiently ensured. If the asymmetry property (Asym) is greater than the above range, the amount of the displacement caused by the piezoelectric strain is lessened and the amount of the displacement cannot be sufficiently ensured.

Therefore, the diffraction peak specifically on the plane (200) needs to have the asymmetry property in the above range in order to sufficiently ensure the amount of the displacement.

The asymmetry property specifically on the plane (200) has been described. The asymmetry property can be further conspicuously observed on the plane (400). The range of the asymmetry property is preferably 0.03 or greater and 0.65 or smaller, more preferably 0.20 or greater and 0.45 or smaller. If the asymmetry property is smaller than the above range, the amount of the displacement accompanied by the rotational strain is lessened and the amount of the displacement cannot be sufficiently ensured. If the asymmetry property is greater than the above range, the amount of the displacement caused by the piezoelectric strain is lessened and the amount of the displacement cannot be sufficiently ensured.

Next, the preferred orientation of the PZT film 24 and an orientation degree (an orientation rate) are described. Within the first embodiment, the preferred orientation (100) of PZT is preferable. The orientation degree is expressed by $\rho(hkl)=I(hkl)/\Sigma I(hkl)$, where $\rho(hkl)$ represents the orientation degree of a plane direction (hkl), $I(hkl)$ represents the peak strength of an arbitrary orientation, and $\Sigma I(hkl)$ represents the sum of the peak strengths. When the sum of the peak strengths obtained by a θ−2θ measurement of an X-ray diffraction method is 1, the orientation degree of the orientation (100) calculated based on the ratio of the peak strength of each orientation is preferably 0.75 or greater (an orientation rate of 75% or greater), more preferably 0.85 or greater (an orientation rate of 85% or greater). If the orientation degree is the above value or smaller, the piezoelectric strain cannot be sufficiently obtainable and the amount of the displacement cannot be sufficiently ensured. As the orientation degree (the orientation rate) is closer to 1, a better amount of the displacement can be ensured.

The material of the electro-mechanical transduction film 24 is barium titanate as a complex oxide other than the above described PZT. In this case, an original material is a compound of barium alkoxide and titanium alkoxide and is caused to dissolve in a common solvent so as to enable to make a precursor solution of barium titanate.

These materials are described by a general expression $ABO_3$, where A represents at least one element selected from Pb, Ba, and Sr, and B represents at least one element selected from Ti, Zr, Sn, Ni, Zn, Mg, and Nb. A complex oxide having $ABO_3$ as a major component can be preferably used as the electro-mechanical transduction film. The element of the above A and B can be described as $(Pb_{1-x}, Ba_x)(Zr,Ti)O_3$ and $(Pb_{1-x}, Sr_x)(Zr,Ti)O_3$. This is a case where Pb in the A site is partly replaced by Ba or Sr. This replacement is possible in an bivalent element, and an effect of the replacement is a reduction of a property degradation caused by evaporation of lead during heat treatment.

The relative permittivity of the electro-mechanical transduction film 24 is preferably 600 or greater and 2000 or smaller, more preferably 1200 or greater and 1600 or smaller. By determining the relative permittivity to be in the above range, a sufficient displacement property is obtainable. Further, a polarization treatment can be sufficiently performed, and a sufficient property is obtainable for a displacement degradation after a continuous drive.

A manufacturing method of manufacturing the electro-mechanical transduction film 24 is not specifically limited. For example, it is possible to manufacture by a spin coater using a sputtering method or a sol-gel method. In any case, because patterning is required, a predetermined pattern is obtainable by etching using photolithography.

A manufacturing procedure of manufacturing PZT using the sol-gel method is described, as an example. Lead acetate, zirconium alkoxide, and a titanium alkoxide compound are an original material. The original material is dissolved in a common solvent of methoxyethanol so as to obtain a homogeneous solution. Thus, a precursor solution of PZT can be manufactured. A metallic alkoxide compound easily causes hydrolytic cleavage by moisture in the atmospheric air. To prevent this, acetone, acetic acid, or diethanolamine may be added as a stabilization agent to the precursor solution.

In a case where the PZT film is obtained on an entire surface of a foundation substrate formed with the lower electrode or the like, a coater film is formed by a solution coating method such as spin coating and thermal treatments such as solvent drying, thermal decomposition, and crystallization are provided so as to obtain the PZT film. Degeneracy from the coater film to a crystallization film is accompanied by a volume contraction. Therefore, in order to obtain a crack-free film, it is preferable to adjust the concentration of the precursor solution so as to obtain a film thickness of 100 nm or smaller during a single process.

In a case where the PZT film is obtained by an inkjet process, it is possible to obtain a patterned film using a manufacturing flow similar to that for the second electrode 232. A surface reforming material differs depending on the material of the foundation (the first electrode 231). If the foundation is made of an oxide, it is preferable that the surface reforming material is mainly made of a silane composition. If the foundation is made of a metal, it is preferable that the surface reforming material is mainly made of alkanethiol.

The thickness of the electro-mechanical transduction film 24 is not specifically limited. It is possible to arbitrarily determine the film thickness depending on a requisite amount of the displacement or the like. For example, the film thickness is preferably 0.5 to 5 µm, more preferably 1 to 2 µm. The above range of the film thickness sufficiently causes the displacement. By adopting the above range of the film thickness, the number of processes of the lamination and the film formation does not increase more than necessary, and the manufacture can be productive.

Described next is the materials of the first insulative protection film 31, the second insulative protection film, the connection member 35 for connecting the individual electrode and the individual electrode pad, and the connection member 37 for connecting the common electrode and the common electrode pad, which form the electro-mechanical transduction element 20 of the first embodiment.

It is preferable that the material of the first insulative protection film 31 prevents a damage given to the electro-mechanical transduction element during the processes of the film formation or the etching and is hard to cause moisture in the atmospheric air to permeate. Therefore, the material is preferably a dense inorganic material (an inorganic compound).

It is preferable to use an oxide film, a nitride film, or a carbide film in order to obtain a high protection performance even though the film is thin. Specifically, the above material preferably has a good contact with the materials of the upper electrode 25 and the lower electrode 23, which are a foundation in contact with the first insulative protection film 31, the material of the electro-mechanical transduction film 24, and the material on the upper surface of the substrate 21. As an example, the material of the first insulative protection film 31 is made of an oxide ceramics such as $Al_2O_3$, $ZrO_2$, $Y_2O_3$, $Ta_2O_3$, $TiO_2$ or the like.

The film formation method of the first insulative protection film 31 is not specifically limited and is preferably a method which does not damage the electro-mechanical transduction element. Therefore, it is preferable to use a vapor deposition method or an ALD method, and the ALD method is more preferable because options of an applicable material is wider than those of the vapor deposition method. Specifically, according to the ALD method, it is possible to manufacture a thin film having an extremely high film density so as to prevent a damage to the electro-mechanical transduction element 20 during the process.

The film thickness of the first insulative protection film 31 is not specifically limited. However, it is preferable that the thickness sufficiently ensures a performance of protecting the electro-mechanical transduction element and is as thin as possible to prevent the displacement of the electro-mechanical transduction element. For example, it is preferable that the film thickness of the first insulative protection film 31 is in a range of 20 nm or greater and 100 nm or smaller. In a case where the film thickness is thicker than 100 nm, the displacement of the electro-mechanical transduction element 20 may be prevented. On the other hand, in a case where the film thickness is thinner than 20 nm, the function of protecting the electro-mechanical transduction element 20 may be insufficient and the performance of the electro-mechanical transduction element 20 may be degraded.

Further, the first insulative protection film 31 may be formed by multiple layers. For example, in a case where the first insulative protection film 31 is formed by two layers, a second layer of the first insulative protection film 31 is made thicker than a first layer. In order to prevent a vibration displacement of the electro-mechanical transduction element 20 by the thicker second layer, an opening portion may be formed on the second layer of the first insulative protection film 31 in the vicinity of the upper electrode 25. In this case, the second layer of the first insulative protection film 31 is an oxide, a nitride, a carbide, or a composite compound of the oxide, the nitride, and the carbide, and preferably $SiO_2$ ordinarily used for a semiconductor device. An arbitrary method is used for the film formation such as a CVD method, a sputtering method, or the like. Specifically, in consideration of a step of the coating on a pattern such as the electrodes, the CVD method is preferable because the CVD method can isotropically form a film.

The thickness of the second layer of the first insulative protection film 31 is not specifically limited and is preferably a film thickness of preventing an insulation breakdown in consideration of voltages applied to the electrodes. Said differently, it is preferable to set the electric field intensity applied to the first insulative protection film 31 in a range of preventing the insulation breakdown. Further, in consideration of a surface property or a pinhole of the foundation of the the first insulative protection film 31, the film thickness of the first insulative protection film 31 is preferably 200 nm or greater, more preferably 500 nm or greater.

Described next is the materials of the connection member 35 for connecting the individual electrode and the individual electrode pad and the connection member 37 for connecting the common electrode and the common electrode pad illustrated in FIG. 3. The materials of the connection member 35 for connecting the individual electrode and the individual electrode pad and the connection member 37 for connecting the common electrode and the common electrode pad are not specifically limited and may be various conductive materials. Specifically, the materials are preferably a metallic electrode material selected from Cu, Al, Au, Pt, Ir, an Ag alloy, or an Al alloy.

The manufacturing method of the connection member 35 for connecting the individual electrode and the individual electrode pad and the connection member 37 for connecting the common electrode and the common electrode pad are not specifically limited and may be manufactured by an arbitrary method. For example, in the above manufacturing method, the connection member 35 for connecting the individual electrode and the individual electrode pad and the connection member 37 for connecting the common electrode and the common electrode pad is formed by a sputtering method or a spin coat method and are provided with a predetermined pattern by an etching using photolithography.

The film thicknesses of the connection members 35 and 37 are not specifically limited and preferably 0.1 µm or greater and 20 µm or smaller, more preferably 0.2 µm or greater and 10 µm or smaller. If the film thickness is thinner than the above range, the resistance becomes great so as to possibly prevent a sufficient electric current from flowing therethrough. Further, if the film thickness is thicker than the above range, productivity is lowered because a certain time is required for the manufacturing process. Such lowered productivity is not preferable.

Further, when the first insulative protection film 31 is provided, these connection members 35 and 37 are connected to the individual electrode (the upper electrode 25) and the common electrode (the lower electrode 23) through contact holes 32. The contact holes 32 are provided in the first insulative protection film 31. The size of the contact hole 32 is not specifically limited and may be, for example, 10 µm×10 µm. The contact resistances in the contact holes 32 are preferably 10 Ω or smaller for the common electrode 23 and preferably 1 Ω or smaller for the individual electrode 25. The above ranges of the contact resistances enable sufficient electric currents to stably supply to the electrodes. Specifically, it is more preferable to make the contact resistances in the contact holes 32 to be 5 Ω or smaller for the common electrode 23 and 0.5 Ω or smaller for the individual electrode 25.

Next, the second insulative protection film 38 is described. The second insulative protection film 38 is a passivation layer having a function of protecting the connection member 35 for connecting the individual electrode and the individual electrode pad and the connection member 37 for connecting the common electrode and the common electrode pad.

Referring to FIG. 3, the second insulative protection film 38 coats upper portions of the connection member 35 for connecting the individual electrode and the individual electrode pad and the connection member 37 for connecting the common electrode and the common electrode pad except for parts of the individual electrode pad 34 and the common electrode pad 36. With this, even in a case where Al, which is low in cost, or an alloy material whose major component is Al is used for the connection members 35 and 37, a reliability of the electro-mechanical transduction element can be enhanced. Further, because a low cost material can be used for the connection members 35 and 37, a cost of the electro-mechanical transduction element 20 can be reduced.

The material of the second insulative protection film 38 is not specifically limited and an arbitrary inorganic or organic material. However, it is preferable that the material of the second insulative protection film 38 has a low moisture permeability. The above inorganic material may be an oxide, a nitride, a carbide, or the like. The above organic material may be polyimide, an acrylic resin, a urethane resin, or the like. However, in the case of the organic material, there is a case where a sufficient film thickness is required to cause the second insulative protection film 38 to function as an insulative protection film and therefore patterning of such second insulative protection film 38 is difficult. Therefore, it is preferable to use the inorganic material which can perform a function of protecting wiring even though the thickness of the inorganic material is thin. Specifically, Al is used for the connection member 35 for connecting the individual electrode and the individual electrode pad and the connection member 37 for connecting the common electrode and the common electrode pad, it is preferable to use $Si_3N_4$ as the second insulative protection film because $Si_3N_4$ is practically effective in the technology of the semiconductor devices.

The film thickness of the second insulative protection film 38 is preferably 200 nm or greater, more preferably 500 nm or greater. This is because a reliability may be lowered by a corrosion of the connection member 35 or 37, which may occur to cause a disconnection of the connection member 35 or 37, because a sufficient passivation function cannot be performed when the film thickness is thin.

The second insulative protection film 38 preferably has an opening portion above the electro-mechanical transduction part 200. A droplet discharge head (described below) preferably has the opening portion also in the vibration plate 22. With this, the electro-mechanical transduction element 20 with a high efficiency and a high reliability is obtainable.

Opening portions for exposing the common electrode pad and the individual electrode pad through the second insulative protection film 38 may be formed in the second insulative protection film 38. In order to form the opening portions, a photolithography method and a dry etching may be used.

The areas of the common electrode pad 23 and the individual electrode pad 25 are not specifically limited. Here, an electric charge is supplied from the common electrode pad 23 and the individual electrode pad 25 when a polarization treatment is performed after forming the common electrode pad 23, the individual electrode pad 25, and the second insulative protection film 38. Therefore, it is preferable to determine the area for enabling the sufficient polarization treatment. For example, the sizes of the common electrode pad 23 and the individual electrode pad 25 are preferably 50×50 µm$^2$ or greater, more preferably 100×300 µm$^2$ or greater.

The electro-mechanical transduction element 20 of the first embodiment has been described. As described above, in the electro-mechanical transduction element 20, the crystal orientation of the PZT film used as the electro-mechanical transduction film 24 has a preferred orientation on a plane (N00), where N is an integer. Regarding the plane (200) of the electro-mechanical transduction element 20, the peak position of the plane (200) exists within a certain range, and the peak itself has an asymmetry property. Therefore, the electro-mechanical transduction element 20 is structured that the peaks obtained by the peak separation resultantly corresponds (belongs) to three crystal structures. The plane (400) of the electro-mechanical transduction element 20 has a structure similar to the above.

According to the electro-mechanical transduction element 20 of the first embodiment, the amount of the displacement enabling an ink discharge property to be preferably maintained can be sufficiently ensured, and simultaneously a stable ink discharge property can be performed by sufficiently suppress degradation of the amount of the displacement even though the ink is continuously discharged.

Figure 4:
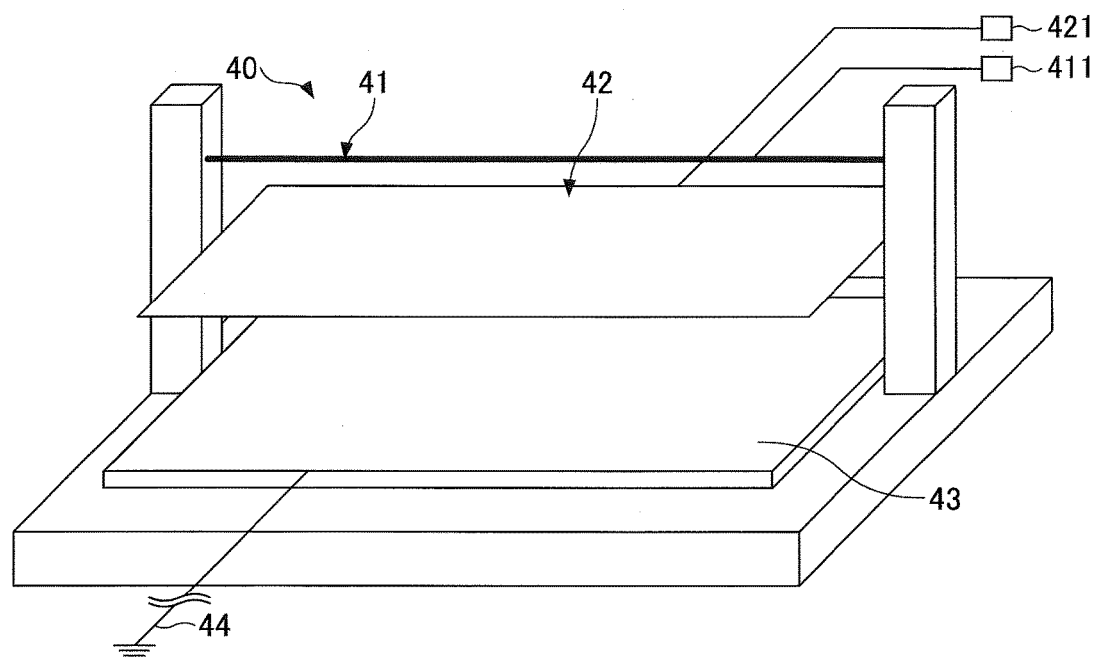
FIG. 4 illustrates an exemplary structure of a polarization apparatus used for performing a polarization treatment.

The above polarizing treatment can be performed using a polarization treatment apparatus 40 illustrated in FIG. 4. A manufacturing method of the electro-mechanical transduction element 20 of the first embodiment is securely applicable to polarization treatments for all electro-mechanical transduction elements, and a yield ratio can be improved.

[Second Embodiment]

A second embodiment is about a droplet discharge head including the electro-mechanical transduction element described in the first embodiment.

Referring to FIG. 10, the droplet discharge head includes a nozzle 81 for discharging a droplet, a pressurizing room 80 to which the nozzle links, and a discharge drive unit that increases the pressure of a liquid inside the pressurizing room.

The discharge drive unit includes a vibration plate 22 forming a part of a wall of the pressurizing room 80 and the electro-mechanical transduction element part 200 arranged on the vibration plate 22 described in the first embodiment.

The electro-mechanical transduction film 24 forming the droplet discharge head works in a stress-free state where the substrate is not bound. Therefore, in the electro-mechanical transduction film 24 of the second embodiment, a peak position of X-ray diffraction caused by the plane (200) is $2\theta=44.45°$ or greater and $44.75°$ or smaller, more preferably, $2\theta=44.55°$ or greater and $44.70°$ or smaller and a peak of diffraction caused by the plane (200) or the plane (400) has an asymmetry property.

Figure 11:
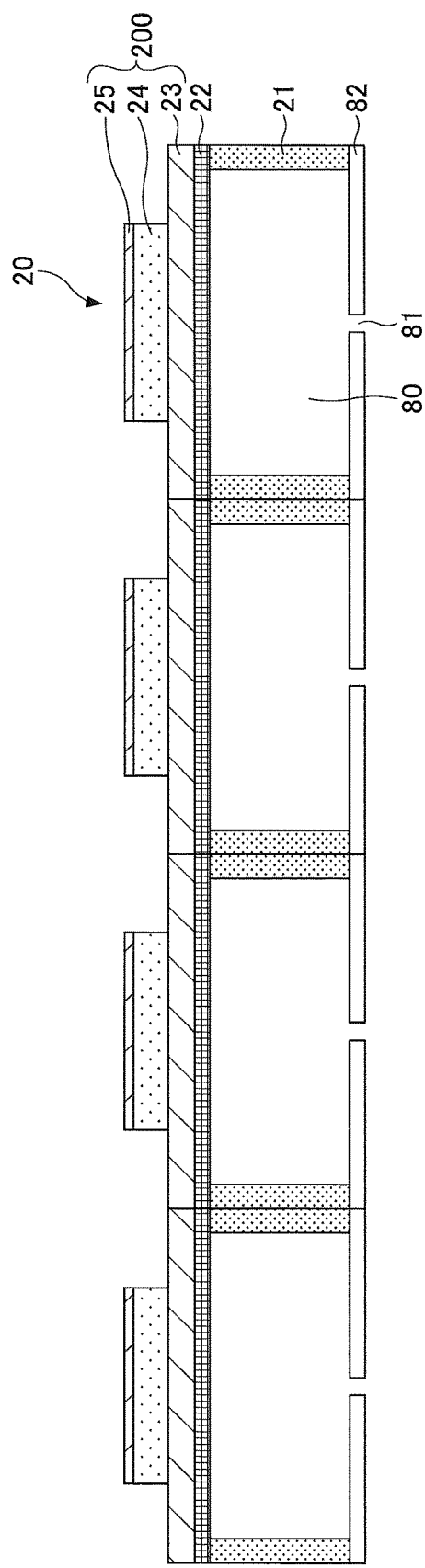
FIG. 11 illustrates a structure of a droplet discharge head of the second embodiment of the present invention.

Referring to FIGS. 10 and 11, the structure is further described. FIG. 10 illustrates the single droplet discharge head. FIG. 10 illustrates a structure of arranging multiple droplet discharge heads.

As illustrated in FIG. 10, in the droplet discharge head, the pressurizing room 80 is formed in the substrate 21, and a nozzle plate 82 provided with the nozzle 81 for discharging the droplet is arranged at a lower end portion of the pressurizing room 80. When a voltage is applied to the electro-mechanical transduction part 200 to displace the electro-mechanical transduction film 24, the vibration plate 22 deforms and displaces so as to discharge a liquid in the pressurizing room 80 from the nozzle 81. Multiple droplet discharge heads described above are arranged to obtain the structure illustrated in FIG. 11. In FIGS. 10-11, a liquid supply means, a flow route, and a flow resistance are omitted.

The droplet discharge head includes the electro-mechanical transduction element 20 (the electro-mechanical transduction part 200) of the first embodiment. Therefore, the amount of the displacement enabling the good ink discharge property to be maintained and simultaneously the degradation of the amount of the displacement is suppressed when the discharge continues. Thus, the droplet discharge head can perform a stable droplet discharge.

[Third Embodiment]

A third embodiment is about a droplet discharge device including the droplet discharge head described in the second embodiment.

Figure 12:
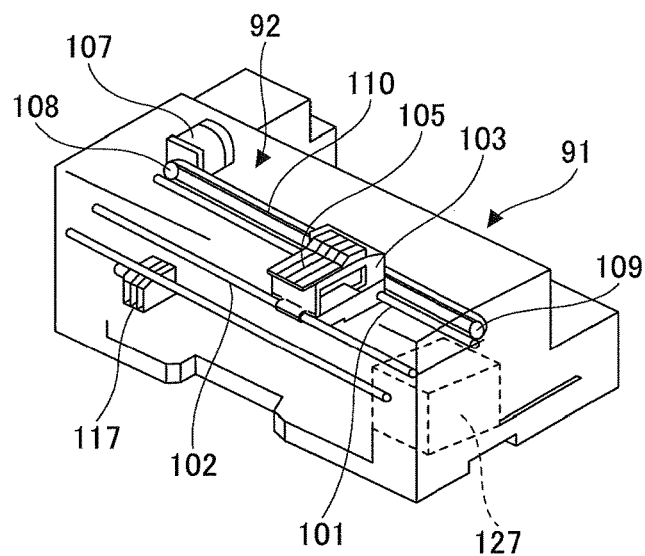
FIG. 12 is a perspective view of a droplet discharge device of a third embodiment of the present invention.
Figure 13:
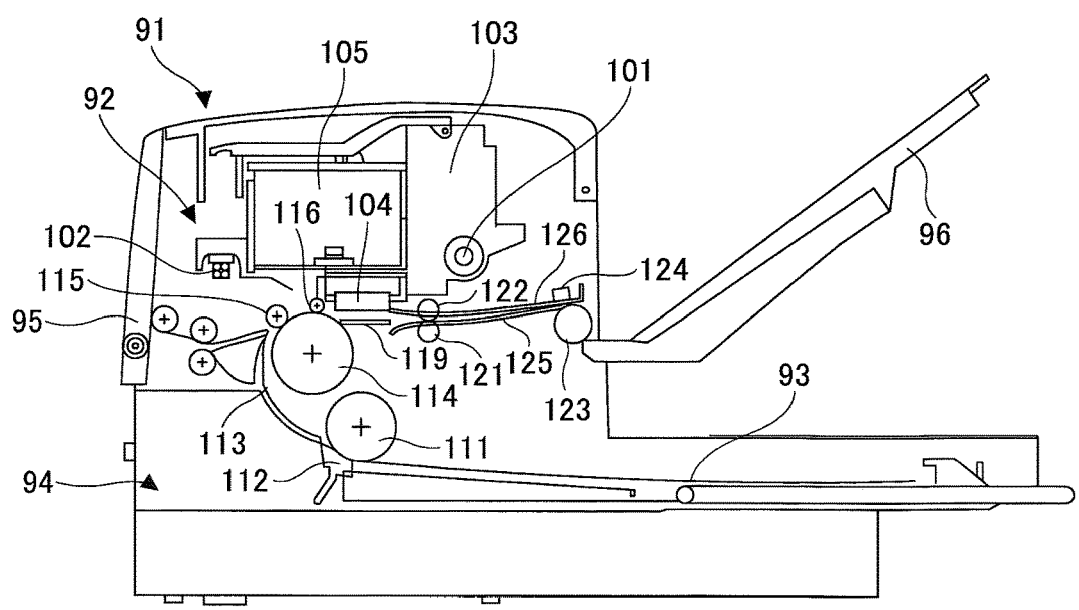
FIG. 13 is a side view of a mechanical portion of a droplet discharge device of a third embodiment of the present invention.

Referring to FIGS. 12 and 13, a structure of the droplet discharge device of the third embodiment is described. FIG. 12 is a perspective view of explaining the droplet discharge device. FIG. 13 is a side view of explaining the droplet discharge device.

The droplet discharge device includes a record apparatus main body 91, a carriage 103 which is provided inside the record apparatus main body 91 and is movable in a main scanning direction, a record head which is installed in the carriage 103 and includes the droplet discharge head of the second embodiment, and a print mechanical portion 92 formed by an ink cartridge which supplies an ink to the record head.

A paper feeding cassette 94 (a paper feeding tray) which can load a great number of papers 93 can be provided to a lower portion of the record apparatus main body 91 so as to be attached to or detached from a front side of the record apparatus main body 91. A manual feed tray 95 for feeding the paper 93 is provided in the record apparatus main body 91 so as to be opened or closed. After the paper 93 is fed from the paper feeding cassette 94 or the manual feed tray 95, a predetermined image is recorded on the paper 93 by the print mechanical portion 92. Thereafter, the recorded paper is ejected from a paper ejection tray 96 provided on the back surface side of the record apparatus main body 91.

The carriage 103 having the print mechanical portion 92 is slidably supported in the main scanning direction by a main guide rod 101 and a sub guide rod 102, which are guide members laterally bridging right and left side plates (not illustrated). A head 104 including the droplet discharge heads respectively discharging ink droplets of colors, namely yellow (Y), cyan (C), magenta (M), and black (Bk), is provided in the carriage 103 so that multiple ink discharge ports (nozzles) are arranged in a direction perpendicular to the main scanning direction. A direction of discharging the ink droplet is set downward. Ink cartridges 105 respectively supplying the color inks are attached to the carriage 103 so that the ink cartridges 105 can be replaced.

The ink cartridge 105 includes an atmospheric air port linking to the atmospheric air on its upper side, a supply port supplying the ink to an inkjet head on its lower side, and a porous body filled with the ink in its inside. A capillary force of the porous body maintains a negative pressure of the ink to be supplied to the inkjet head. Although the head 104 is for the multiple colors, the head may be a single head including nozzles respectively discharging various color ink droplets.

The carriage 103 is engaged with the main guide rod 101 so that a rear side (a downstream side in a paper conveyance direction) of the carriage 103 is slidable on the main guide rod 101 and a front side (an upstream side in the paper conveyance direction) of the carriage 103 is slidable on the sub guide rod 102. A timing belt 110 bridges between a drive pulley 108 rotationally driven with a tension by a main scanning motor 107 and a driven pulley 109 so as to movably scan the carriage 103 in the main scanning direction. This timing belt is fixed to the carriage 103, and the carriage 103 is reciprocally driven by forward and reverse rotations of the main scanning motor 107.

Next, a mechanism of conveying the paper 93 set in the paper feeding cassette 94 into a lower side of the head 104 is described. The mechanism includes a paper feeding roller 111 and a friction pad 112 which separate and feed the paper 94 from the paper feeding cassette 94, a guide member 113 guiding the paper 93, and a conveyance roller 114 which reverses the fed paper 93 and conveys it. Further, the mechanism further includes a conveyance skid 115 pressed onto a peripheral surface of the conveyance roller 114 and a tip skid 116 for regulating a feed angle of the paper 93 from the conveyance roller 114. The conveyance roller 114 is rotatably driven by a sub scanning motor 117 through gears.

A print receiving member 119 as a paper guide member guiding the paper 93 fed from the conveyance roller 114 is provided in an area corresponding the a moving range of the carriage 103 in the main scanning direction. A conveyance skid 121 and a spur 122 rotationally driven to send the paper 93 in a paper ejection direction are provided on the downstream side of the paper conveyance direction of the print receiving member 119. Further, a paper ejection roller 123 and a spur 124 which are provided to send the paper 93 into the paper ejection tray 96 and guide members 125 and 126 forming a paper ejection route are arranged.

At a time of recording, by driving the record head 104 depending on an image signal while moving the carriage 103, the ink is discharged onto the stopping paper 93 to record one row. Thereafter, the paper 93 is conveyed by a predetermined distance and a next row is recorded. After receiving a record end signal or a signal indicating that an end of the paper 93 reaches a record area, a record operation is completed and the paper 93 is ejected.

A recovery device 127 for recovering a discharge failure of the head 104 is arranged at a position apart from the record area on the right end side in the move direction of the carriage 103. The recovery device 127 includes a capping means, a suction means, and a cleaning means. The carriage 103 is moved on a side of the recovery device 127 while waiting for the print, the head 104 is capped by the capping means, and the discharge port is maintained to be in a wet condition. Thus, the discharge failure caused by ink dry can be prevented. By discharging the ink which is not related to the record during the record or the like, ink viscosity of all discharge ports is made constant and a stable discharging performance is maintained.

In a case where the discharge failure or the like occurs, the capping means is used to tightly pack the discharge port (the nozzle) of the head 104 and the bubbles and so on are sucked out by the suction means together with the ink from the discharge port through a tube. With this, the ink, dust, and so on attached onto a surface of the discharge port are removed by the cleaning means so as to recover the discharge failure. The sucked ink is ejected to a disposal ink reservoir (not illustrated) installed in a lower portion of the record apparatus main body 91 and is absorbed and held by an ink absorbing body inside the disposal ink reservoir.

The droplet discharge device of the third embodiment includes the droplet discharge head described in the second embodiment. Therefore, the amount of the displacement enabling to maintain a good ink discharge property can be sufficiently ensured and the degradation of the amount of the displacement can be sufficiently suppressed even if the ink is continuously discharged. Therefore, the droplet discharge device can perform a stable droplet discharge.

[Fourth Embodiment]

Figure 14:
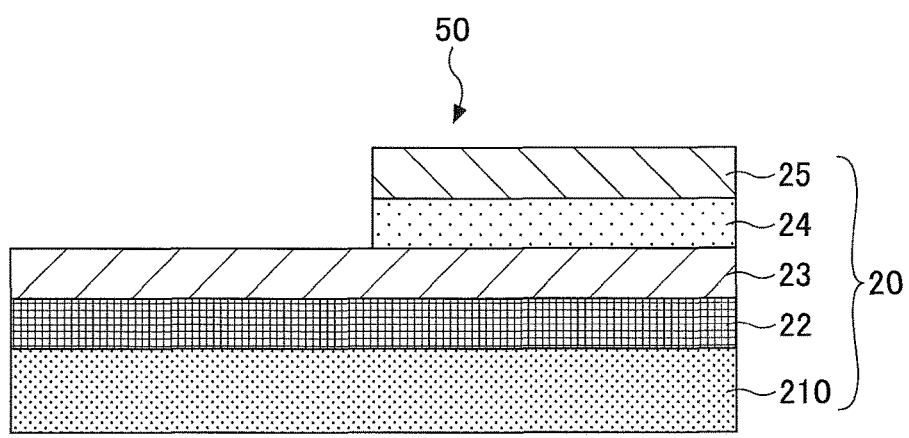
FIG. 14 is a schematic cross-sectional view of a part of a cantilever of a fourth embodiment of the present invention.

A fourth embodiment is about a cantilever including the electro-mechanical transduction element described in the first embodiment. Referring to FIG. 14, a structural example of a cantilever 50 of the fourth embodiment is described. FIG. 14 is a cross-sectional view schematically illustrating a part of the cantilever 50.

For example, the cantilever 50 of the fourth embodiment can be used as a micro scanner manufactured using a microfabrication technique for silicon (Si). The micro scanner is, for example, a scanning probe microscope such as an atom force microscope (AFM), a scanning tunnel microscope (STM) or the like and a mirror drive device.

The above cantilever 50 has a basic structure substantially similar to the electro-mechanical transduction element 20 illustrated in FIG. 1. The cantilever 50 includes a substrate 210, the vibration plate 22, the lower electrode 23, the electro-mechanical transduction film 24, and the upper electrode 25. The upper electrode 25 to the substrate 210 of the cantilever 50 are manufactured by etching. Referring to FIG. 3, each of the upper electrodes 25 may be connected to the corresponding individual electrode pad 34. The connection member 35 for connecting the individual electrode and the individual electrode pad may electrically connect the individual electrode 25 to the individual electrode pad 34. Each of the lower electrodes 23 may be connected to the common electrode pad 36. The connection member 37 for connecting the common electrode and the common electrode pad may electrically connect the common electrode 27 to the common electrode pad 36. Further, it is possible to provide a second insulative protection film 38 above the common electrode pad 36 and the individual electrode pad 34.

Within the fourth embodiment, a trenching process is performed for the foundation substrate 21 of the second embodiment illustrated in FIG. 10. A difference between the second and fourth embodiments is that the PZT film 24 receives a bind of the substrate 210 when the PZT film 24 displaces because the thickness of the substrate 210 is thicker than the substrate 21 of the second embodiment without a bind to the PZT film 24 of the substrate 21.

In the cantilever 50 of the fourth embodiment, because the PZT film 24 receives the bind of the substrate 210, a crystal lattice in a direction perpendicular to the substrate 210 becomes hard to extend and therefore peak position (2θ) of the diffraction becomes great. Therefore, in the cantilever 50 in which the PZT film 24 is bound by the substrate 210, the peak position of X-ray diffraction caused by the plane (200) of the PZT film 24 is preferably 2θ=44.50° or greater and 44.80° or smaller, more preferably 2θ=44.65° or greater and 44.75° or smaller. Further, a peak of the diffraction caused by the plane (200) or the plane (400) has an asymmetry property.

Therefore, in the cantilever 50 in which the electro-mechanical transduction film 24 is bound by the substrate 210, the amount of the displacement of the PZT film 24 can be sufficiently ensured. Said differently, in a case where the electro-mechanical transduction element 20 is applied to the above device, it becomes possible to ensure a stable piezoelectric performance.

EXAMPLES

Hereinafter, specific examples are described. However, the present invention is not limited to these examples. Hereinafter, procedures of manufacturing samples of the examples and comparative examples are described.

Example 1

The substrate is prepared by forming a thermally-oxidized film (having a film thickness of 1 μm) on a 6-inch silicon wafer. Next, the lower electrode (the first and second electrodes) is formed on the substrate. The lower electrode has a lamination structure where a contact layer, a metallic electrode film, and an oxide electrode film are laminated.

The contact layer is formed by providing a film formation of a titanium film (having a film thickness of 30 nm) at a film formation temperature of 350° C. by a sputtering apparatus and thereafter providing thermal oxidation at 750° C. using RTA. Further, a metallic electrode film of a platinum film (having a film thickness of 100 nm) and an oxide electrode film of a LaNiO$_3$ film (having a film thickness of 50 nm) are formed by sputtering. A substrate heating temperature at the time of the film formation is 550° C. for the platinum film and 450° C. for the LaNiO$_3$ film. Thereafter, RTA is used as a post anneal treatment (550° C.)

Next, the electro-mechanical transduction film is formed. A solution adjusted to have an amount ratio of substance of Pb:Zr:Ti=114:49:51 is prepared and the electro-mechanical transduction film is formed by a spin coat method.

Specifically, a synthesis of a precursor coating liquid uses lead acetate 3 hydrate, isopropoxide titanium, and isopropoxide zirconium as an original material. A crystal water of lead acetate is dissolved into methoxy ethanol and dehydrated. The amount of lead is excessive relative to the stoichiometric composition. This is to prevent a degradation of the crystal caused by so-called lead missing during the heat treatment. Isopropoxide titanium and isopropoxide zirconium are dissolved into methoxy ethanol, an alcohol interchange reaction and an esterification reaction are proceeded, the resultant matter is mixed with the methoxy ethanol solution into which the lead acetate is dissolved as described above so as to synthesize a precursor solution of PZT. At this time, a PZT concentration in the precursor solution of PZT is 0.5 mol/L.

The film is formed by the spin coat method using the precursor solution of PZT. After the film formation, it is dried at 120° C. and provided with a thermal decomposition at 120° C. Then, the processes of the film formation, the drying, and the thermal decomposition are repeated to form a laminated film. After the thermal decomposition of the third layer, the crystallization heat treatment (a temperature of 750° C.) is performed by RTA (rapid heat treatment). At this time, the film thickness of PZT was 240 nm. These processes are totally repeated by 8 times to totally laminate 24 layers, and the electro-mechanical transduction film having the film thickness of about 2 µm is obtained.

Next, the upper electrode (the third and fourth electrodes) is formed. An oxide electrode film of $LaNiO_3$ film (having a film thickness of 40 nm) is formed and a metallic electrode film of a platinum film (having a film thickness of 125 nm) is formed by sputtering. Thereafter, a film formation of photoresist (TSMR8800) manufactured by TOKYO OHKA KOGYO Co., Ltd. is performed by the spin coat method, and a resist pattern is formed by an ordinary photolithography. Thereafter, a pattern as illustrated in FIG. 3 is manufactured using an ICP etching apparatus (manufactured by SUMCO corporation).

Next, the first insulative protection film of an $Al_2O_3$ film is formed by an ALD method so that the film thickness becomes 50 nm. At this time, Al is supplied as trimethyl aluminum (TMA) and O is supplied as $O_3$ generated by an ozone generator. The Al and $O_3$ are alternately supplied and laminated to form the the $Al_2O_3$ film.

Thereafter, as illustrated in FIG. 3, a contact hole 32 is formed by etching. Al is provided with a sputtering film formation as the connection member for connecting the individual electrode and the individual electrode pad, the connection member for connecting the common electrode and the common electrode pad, the individual electrode pad, and the common electrode pad. Patterns of these are formed by etching. The distance between the connection members for connecting the individual electrode and the individual electrode pad is set to be 80 µm.

Next, the second insulative protection film of a $Si_3N_4$ film is formed by a plasma CVD so as to have a film thickness of 500 nm. Thereafter, an opening portion is formed in the individual electrode pad and the common electrode pad to thereby manufacture the electro-mechanical transduction element.

Thereafter, a polarization treatment apparatus 40 illustrated in FIG. 4 is used to perform a polarization treatment by a corona charging treatment. A corona electrode used for the corona charging treatment is a tungsten wire having a diameter of 50 µm. Conditions for the polarization treatment were a treatment temperature of 80°, a corona voltage of 9 kV, a grid voltage of 2.5 kV, a treatment time of 30 seconds, a distance between the corona electrode and the grid electrode of 4 nm, and a distance between the grid electrode and the stage of 4 mm.

Example 2

A solution adjusted to have an amount ratio of substance of Pb:Zr:Ti=115:47:53 is prepared and the electro-mechanical transduction film is formed in a manner similar to Example 1 except for the spin coat method. Thereafter, the polarization treatment is performed in a manner similar to Example 1.

Example 3

A solution adjusted to have an amount ratio of substance of Pb:Zr:Ti=115:45:55 is prepared and the electro-mechanical transduction film is formed in a manner similar to Example 1 except for the spin coat method. Thereafter, the polarization treatment is performed in a manner similar to Example 1.

Example 4

A solution adjusted to have an amount ratio of substance of Pb:Zr:Ti=115:53:47 is prepared and the electro-mechanical transduction film is formed in a manner similar to Example 1 except for the spin coat method. Thereafter, the polarization treatment is performed in a manner similar to Example 1.

Example 5

A solution adjusted to have an amount ratio of substance of Pb:Zr:Ti=115:55:45 is prepared and the electro-mechanical transduction film is formed in a manner similar to Example 1 except for the spin coat method. Thereafter, the polarization treatment is performed in a manner similar to Example 1.

Example 6

After the lower electrode (the first electrode) of a Pt film is formed, a Ti film is formed to have a thickness of 5 nm by sputtering. Thereafter, this is oxidized at 750° C. by the RTA. The electro-mechanical transduction element is manufactured except for the formation of the $SrRuO_3$ film having the thickness of 40 nm. The polarization treatment is performed in a manner similar to Example 1.

Example 7

After the lower electrode (the first electrode) of a Pt film is formed, an electro-mechanical transduction film is formed by sputtering. Thereafter, this is oxidized at 750° C. by the RTA. The electro-mechanical transduction element is manufactured except for the formation of the $SrRuO_3$ film having the thickness of 40 nm. The polarization treatment is performed in a manner similar to Example 1.

Comparative Example 1

A solution adjusted to have an amount ratio of substance of Pb:Zr:Ti=115:60:40 is prepared and the electro-mechanical transduction film is formed in a manner similar to Example 1 except for the spin coat method. Thereafter, the polarization treatment is performed in a manner similar to Example 1.

Comparative Example 2

A solution adjusted to have an amount ratio of substance of Pb:Zr:Ti=115:40:60 is prepared and the electro-mechanical transduction film is formed in a manner similar to Example 1 except for the spin coat method. Thereafter, the polarization treatment is performed in a manner similar to Example 1.

Electric properties and displacement property (piezoelectric constants) of the electro-mechanical transduction elements of Examples 1 to 7 and Comparative Examples 1 and 2 are evaluated. As to a displacement evaluation, a trench is processed on the back surface side of the substrate (see FIG. 10), and a vibration evaluation is performed. The amount of displacement caused by applying an electric field (150 kV/cm) is measured by a laser Doppler vibrometer and calculated by matching using a simulation. After evaluating initial properties, durability evaluations (properties immediately after repeatedly applying voltages by $10^{10}$ times) are performed. In states where the trenches are processed on the back surface sides, crystal properties are evaluated using XRD. Detailed results are illustrated in FIG. 15 together with an orientation rate, a peak position, an asymmetry property, and the number of belonging crystal structures.

As to Examples 1 to 7, the initial properties and the results of durability tests are similar to those of an ordinary ceramic sintered body. As to Examples 1 to 7, the piezoelectric constants were −120 to −160 pm/V. As to Example 3, the peak position of PZT(200) shifted on the high angle side. Therefore, the rotational strain element is conspicuous and slight drops of the piezoelectric before and after endurance were observed. As to Examples 4 and 5, the peak positions of PZT(200) shifted on the low angle sides and the rotational strain elements are little. Therefore, the initial piezoelectric constant is slightly low. Drops of the piezoelectric constants before and after endurance were little. After the endurance, properties similar to that of the ordinary ceramic sintered body were obtainable.

As to Examples 1, 6, and 7, differences among the peak positions of PZT(200) are small. In Examples 6 and 7 where the orientation rates of PZT(100) are small, the initial piezoelectric constants were small.

On the other hand, as to Comparative Examples 1 and 2, the peak positions of PZT(200) were 44.45° or greater and 44.47° or smaller, the asymmetry properties were 0.03 or greater and 0.45 or smaller, and the numbers of belonging crystal structures were 3. These results are different from the ranges in ( ) described in the first embodiment. Thus, it is known that the initial property of Comparative Example 1 is slightly inferior to the ordinary ceramics sintered body. As to the property of Comparative Example 2 after $10^{10}$ times (immediately after repeatedly applying the voltages by $10^{10}$ times), the piezoelectric constant was conspicuously degraded in comparison with Examples 1 to 7.

Liquid discharge heads as illustrated in FIGS. 10 and 11 are manufactured respectively using the electro-mechanical transduction elements of Examples 1 to 7, and liquid discharge evaluations were conducted. Discharge states were checked when an ink having a viscosity of 5 cp was used and a voltage between −10 to −30 V was applied. Resultantly, it was checked that the inks were discharged from all nozzle ports.

According to the present invention, there is provided an electro-mechanical transduction element which surely maintain the amount of displacement sufficient to perform a good ink discharge property in consideration of a substrate.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although an electro-mechanical transduction element has been described in detail, it should be understood that various changes, substitutions, and alterations could be made thereto without departing from the spirit and scope of the invention.

This application is based upon and claims the benefit of priority of the prior Japanese Patent Application No. 2014-110179, filed on May 28, 2014, the entire contents of which are incorporated herein by reference.

What is claimed is:

1. An electro-mechanical transduction element comprising:
    a lower electrode formed above a substrate;
    an electro-mechanical transduction film which is formed on the lower electrode and is made of an undoped perovskite-type crystal containing lead zirconate titanate (PZT); and
    an upper electrode formed on the electro-mechanical transduction film,
    wherein, in a state where the electro-mechanical transduction film is not bound by the substrate, a peak of X-ray diffraction caused by a plane (200) of the electro-mechanical transduction film before a peak separation is performed has an only one local maximum value, a peak position of the peak of the X-ray diffraction caused by the plane (200) of the electro-mechanical transduction film is located between 2θ=44.45° or greater and 44.75° or smaller, and the peak of the X-ray diffraction caused by the plane (200) of the electro-mechanical transduction film or a peak of the X-ray diffraction caused by a plane (400) of the electro-mechanical transduction film before the peak separation is performed has an asymmetry property,
    wherein, when the peak separation is performed for the peak of the X-ray diffraction caused by the plane (200) of the electro-mechanical transduction film or the peak of the X-ray diffraction caused by the plane (400) of the electro-mechanical transduction film, each of the peaks is respectively separated into three separated peaks of the diffraction,
    wherein the three peaks of the diffraction attribute to three crystal structures including an a-domain structure X1 of a tetragonal crystal, a c-domain structure Y1 of the tetragonal crystal, and a structure Z1 of any one of a rhombohedral crystal, an orthorhombic crystal, and a pseudo-cubic crystal, and
    wherein the separated peak of the diffraction attributed to the a-domain structure X1 of the tetragonal crystal is highest among the three separated peaks of the diffraction.

2. An electro-mechanical transduction element comprising:
    a lower electrode formed above a substrate;

an electro-mechanical transduction film which is formed on the lower electrode and is made of an undoped perovskite-type crystal containing lead zirconate titanate (PZT); and an upper electrode formed on the electro-mechanical transduction film, wherein, in a state where the electro-mechanical transduction film is bound by the substrate, a peak of X-ray diffraction caused by a plane (200) of the electro-mechanical transduction film before a peak separation is performed has an only one local maximum value, a peak position of the peak of the X-ray diffraction caused by the plane (200) of the electro-mechanical transduction film is located between 2θ=44.50° or greater and 44.80° or smaller, and the peak of diffraction caused by the plane (200) of the electro-mechanical transduction film or a peak of the X-ray diffraction caused by a plane (400) of the electro-mechanical transduction film before the peak separation is performed has an asymmetry property, wherein, when the peak separation is performed for the peak of the X-ray diffraction caused by the plane (200) of the electro-mechanical transduction film or the peak of the X-ray diffraction caused by the plane (400) of the electro-mechanical transduction film, each of the peaks is respectively separated into three separated peaks of the diffraction, wherein the three peaks of the diffraction attribute to three crystal structures including an a-domain structure X1 of a tetragonal crystal, a c-domain structure Y1 of the tetragonal crystal, and a structure Z1 of any one of a rhombohedral crystal, an orthorhombic crystal, and a pseudo-cubic crystal, and wherein the separated peak of the diffraction attributed to the a-domain structure X1 of the tetragonal crystal is highest among the three separated peaks of the diffraction.

3. The electro-mechanical transduction element according to claim 1, wherein an orientation rate of an orientation (100) of the electro-mechanical transduction film is 75% or greater.

4. The electro-mechanical transduction element according to claim 1, wherein the asymmetry property on the plane (200) of the electro-mechanical transduction film represented by the asymmetry property=(an area (L)−an area (R))/(an area (L)+an area (R)) is 0.03 or greater and 0.45 or smaller, where the area (L) is a peak area on a left side of a center of a peak position of the plane (200) and the area (R) is a peak area on a right side of the center of the peak position of the plane (200).

5. The electro-mechanical transduction element according to claim 1, wherein the electro-mechanical transduction film is made of lead zirconate titanate (PZT), wherein a composition ratio of zirconium (Zr) and titanium (Ti) in the electro-mechanical transduction film is 45% or greater and 55% or smaller.

6. The electro-mechanical transduction element according to claim 1, wherein a polarizability of Pr-Pind is 10 μC/cm² or smaller, where, in a case where a hysteresis loop is measured by applying an electric field intensity of ±150 kV/cm to the electro-mechanical transduction film, a polarization at a time of 0 kV/cm before applying a voltage is designated by Pind and a polarization at a time of returning to 0 kV/cm after applying a voltage of +150 kV/cm is designated by Pr.

7. A manufacturing method of manufacturing an electro-mechanical transduction element, the manufacturing method comprising:

performing a polarization treatment for the electro-mechanical transduction element according to claim 1 by generating an electric charge positively charged by corona discharge.

8. A droplet discharge head comprising:

a nozzle which discharges a droplet;

a pressurizing room, to which the nozzle links; and a discharge drive unit which causes a pressure of a liquid inside the pressurizing room to rise, wherein the discharge drive unit includes a vibration plate which forms a part of a wall of the pressurizing room, a lower electrode formed above the vibration plate, an electro-mechanical transduction film which is formed on the lower electrode and is made of an undoped perovskite-type crystal containing lead zirconate titanate (PZT), and an upper electrode formed on the electro-mechanical transduction film, wherein, in a state where the electro-mechanical transduction film is not bound by the substrate, a peak of X-ray diffraction caused by a plane (200) of the electro-mechanical transduction film before a peak separation is performed has an only one local maximum value, a peak position of the peak of the X-ray diffraction caused by the plane (200) of the electro-mechanical transduction film is located between 2θ=44.45° or greater and 44.75° or smaller, and the peak of the X-ray diffraction caused by the plane (200) of the electro-mechanical transduction film or a peak of the X-ray diffraction caused by a plane (400) of the electro-mechanical transduction film before the peak separation is performed has an asymmetry property, wherein, when the peak separation is performed for the peak of the X-ray diffraction caused by the plane (200) of the electro-mechanical transduction film or the peak of the X-ray diffraction caused by the plane (400) of the electro-mechanical transduction film, each of the peaks is respectively separated into three separated peaks of the diffraction, wherein the three peaks of the diffraction attribute to three crystal structures including an a-domain structure X1 of a tetragonal crystal, a c-domain structure Y1 of the tetragonal crystal, and a structure Z1 of any one of a rhombohedral crystal, an orthorhombic crystal, and a pseudo-cubic crystal, and wherein the separated peak of the diffraction attributed to the a-domain structure X1 of the tetragonal crystal is highest among the three separated peaks of the diffraction.

9. A droplet discharge device comprising:

the droplet discharge head according to claim 8.

10. The electro-mechanical transduction element according to claim 1, wherein, in the state where the electro-mechanical transduction film is not bound by the substrate, the peak position of the X-ray diffraction caused by the plane (200) of the electro-mechanical transduction film is located between 2θ=44.55° or greater and 44.70° or smaller.

11. The electro-mechanical transduction element according to claim 2,
   wherein, in the state where the electro-mechanical transduction film is bound by the substrate, the peak position of the X-ray diffraction caused by the plane (200) of the electro-mechanical transduction film is located between is 2θ=44.65° or greater and 44.75° or smaller.

12. The droplet discharge head according to claim 8,
   wherein, in the state where the electro-mechanical transduction film is not bound by the substrate, the peak position of the X-ray diffraction caused by the plane (200) of the electro-mechanical transduction film is located between 2θ=44.55° or greater and 44.70° or smaller.

* * * * *